United States Patent
DeSteese et al.

(10) Patent No.: US 7,851,691 B2
(45) Date of Patent: Dec. 14, 2010

(54) THERMOELECTRIC DEVICES AND APPLICATIONS FOR THE SAME

(75) Inventors: John G. DeSteese, Kennewick, WA (US); Larry C. Olsen, Richland, WA (US); Peter M. Martin, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 746 days.

(21) Appl. No.: 11/864,595

(22) Filed: Sep. 28, 2007

(65) Prior Publication Data

US 2008/0173537 A1 Jul. 24, 2008

Related U.S. Application Data

(63) Continuation-in-part of application No. 10/726,744, filed on Dec. 2, 2003, and a continuation-in-part of application No. 10/727,062, filed on Dec. 2, 2003.

(60) Provisional application No. 60/558,298, filed on Mar. 30, 2004.

(51) Int. Cl.
  *H01L 35/30* (2006.01)
  *H01L 35/34* (2006.01)
  *C23C 14/34* (2006.01)
(52) U.S. Cl. .......... 136/201; 136/205; 136/238; 136/239; 136/240; 136/241; 204/192.14; 204/192.15; 204/192.25
(58) Field of Classification Search ......... 136/200–242; 204/192.14, 192.15, 192.25
See application file for complete search history.

(56) References Cited

U.S. PATENT DOCUMENTS

| | | |
|---|---|---|
| 3,554,815 A | 1/1971 | Osborn |
| 3,648,470 A | 3/1972 | Schultz |
| 3,900,603 A | 8/1975 | Rittmayer et al. |
| 3,931,673 A | 1/1976 | Eggemann |
| 3,945,855 A | 3/1976 | Skrabek et al. |
| 4,036,665 A | 7/1977 | Barr et al. |
| 4,092,140 A | 5/1978 | Cerutti et al. |
| 4,125,122 A | 11/1978 | Stachurski |
| 4,312,402 A | 1/1982 | Basiulis |
| 4,328,677 A | 5/1982 | Meckler |
| 4,447,277 A | 5/1984 | Jayadev et al. |
| 4,497,973 A | 2/1985 | Heath et al. |
| 4,520,305 A | 5/1985 | Cauchy |

(Continued)

FOREIGN PATENT DOCUMENTS

DE 6900274 8/1970

(Continued)

OTHER PUBLICATIONS

Final Office action from the U.S. Patent and Trademark Office in U.S. Appl. No. 10/581,281, dated Dec. 16, 2009.
Notification of Reasons for Refusal from the Japanese Patent Office for Japanese Patent Application No. 2006-542773, dated Jan. 20, 2010 (with translation).

(Continued)

*Primary Examiner*—Jeffrey T Barton
(74) *Attorney, Agent, or Firm*—Klarquist Sparkman, LLP

(57) ABSTRACT

High performance thin film thermoelectric couples and methods of making the same are disclosed. Such couples allow fabrication of at least microwatt to watt-level power supply devices operating at voltages greater than one volt even when activated by only small temperature differences.

23 Claims, 16 Drawing Sheets

U.S. PATENT DOCUMENTS

| | | | |
|---|---|---|---|
| 4,566,961 | A | 1/1986 | Diaz et al. |
| 4,677,416 | A | 6/1987 | Nishimoto et al. |
| 4,859,250 | A | 8/1989 | Buist |
| 4,940,976 | A | 7/1990 | Gastouniotis et al. |
| 5,228,923 | A | 7/1993 | Hed |
| 5,286,304 | A | 2/1994 | Macris et al. |
| 5,505,835 | A | 4/1996 | Sakaue et al. |
| 6,096,964 | A | 8/2000 | Ghamaty et al. |
| 6,096,965 | A | 8/2000 | Ghamaty et al. |
| 6,162,985 | A | 12/2000 | Parise |
| 6,207,887 | B1 | 3/2001 | Bass et al. |
| 6,215,580 | B1 | 4/2001 | Kouta |
| 6,232,543 | B1 | 5/2001 | Nagata |
| 6,288,321 | B1 | 9/2001 | Fleurial et al. |
| 6,340,787 | B1 | 1/2002 | Simeray et al. |
| 6,372,538 | B1 | 4/2002 | Wendt et al. |
| 6,388,185 | B1 | 5/2002 | Fleurial et al. |
| 6,413,645 | B1 | 7/2002 | Graff et al. |
| 6,458,319 | B1 | 10/2002 | Caillat et al. |
| 2002/0139123 | A1 | 10/2002 | Bell |
| 2002/0148236 | A1 | 10/2002 | Bell |
| 2003/0099279 | A1 | 5/2003 | Venkatasubramanian et al. |
| 2003/0140957 | A1 | 7/2003 | Akiba |
| 2004/0075167 | A1 | 4/2004 | Nurnus et al. |
| 2004/0094192 | A1 | 5/2004 | Luo |
| 2004/0231714 | A1 | 11/2004 | Stark et al. |
| 2004/0242169 | A1 | 12/2004 | Albsmeier et al. |
| 2005/0115600 | A1 | 6/2005 | DeSteese et al. |
| 2005/0115601 | A1 | 6/2005 | Olsen et al. |
| 2005/0139250 | A1 | 6/2005 | DeSteese et al. |
| 2007/0125413 | A1 | 6/2007 | Olsen et al. |
| 2009/0084421 | A1 | 4/2009 | Olsen et al. |

FOREIGN PATENT DOCUMENTS

| | | |
|---|---|---|
| DE | 2124465 | 11/1972 |
| DE | 2457586 | 6/1975 |
| DE | 297 23 309 | 3/1997 |
| DE | 10231445 | 1/2004 |
| EP | 0408572 A1 | 8/1989 |
| EP | 0408572 A1 | 1/1991 |
| EP | 0408572 B1 | 2/1993 |
| GB | 1381001 | 1/1975 |
| JP | 61259580 | 11/1986 |
| JP | 02198181 | 6/1990 |
| JP | 3-502859 | 6/1991 |
| JP | 09107129 | 4/1997 |
| JP | 09224387 | 8/1997 |
| JP | 10-51037 | 2/1998 |
| JP | 2003-133600 | 5/2003 |
| JP | 2003179275 | 6/2003 |
| JP | 2004104041 | 4/2004 |
| JP | 2004241657 | 8/2004 |
| JP | 2006086510 | 3/2006 |
| RU | 2113035 | 8/1990 |
| WO | 89/07836 | 8/1989 |
| WO | 00/30185 | 5/2000 |
| WO | 02/23642 | 3/2002 |
| WO | 02/095707 | 11/2002 |
| WO | 03/007391 | 1/2003 |
| WO | 03/015186 | 2/2003 |
| WO | 2004/105143 | 12/2004 |
| WO | 2004/105146 | 12/2004 |
| WO | 2005/074463 | 8/2005 |
| WO | 2005/098970 | 10/2005 |
| WO | 2005/117154 | 12/2005 |
| WO | 2008/013584 | 1/2008 |

OTHER PUBLICATIONS

Final Office action from the U.S. Patent and Trademark Office in U.S. Appl. No. 11/004,611, dated Dec. 17, 2008.

Office Action from Chinese Patent Office for Chinese Patent Application No. 200480035827.0, dated Dec. 5, 2008.

Office action from the U.S. Patent and Trademark Office in U.S. Appl. No. 10/727,062, dated Dec. 31, 2008.

Abrikosov, N Kh, et al., "Phase transitions and electrophysical properties of the solid solutions based on GeTe at the cross-section of GeTe-AgSbTe$_2$," *Izvestiya Akademii Nauk SSSR, Neoorganicheskie Materialy*, Abstract Only, vol. 20, No. 1, pp. 55-59 (1984).

Androulakis et al., "Nanostructuring and its Influence on the Thermoelectric Properties of the AgSbTe$_2$-SnTe Quaternary System," *Materials Research Society Symposium Proceedings*, vol. 886, Abstract Only, 1 page (2006).

Bergstresser, T.R. et al., "Copper on Polyimide Flexible Substrate for Ultra-Thin, High Performance Applications," 4 pages (2000).

Chen, G., "Thermal conductivity and ballistic-phonon transport in the cross-plane direction of superlattices," *Phys. Rev. B*, vol. 57, No. 23, pp. 14958-14973 (Jun. 15, 1998).

Decheva, S.K., "Studies on the Thermoelectric Characteristics of Cold-Pressed Materials of the Type of (GeTe)x-(AgSbTe$_2$) (1–x)," *Bulgarian Journal of Physics*, Abstract Only, vol. 6, No. 2, pp. 194-200 (1979).

DeSteese, J. G. et al., "Technology Development: Wireless Sensors and Controls BT0201," Excerpt from Statement of Work from PNNL to U.S. Department of Energy, Building Technologies Program, 31 pages (Sep. 2004).

DeSteese, J. G., "Thermoelectric Ambient Energy Harvester," a White Paper for the Defense Logistics Agency, pp. 1-4 (undated).

Hicks, L.D. et al., "Effect of quantum-well structures on the thermoelectric figure of merit," *Phys. Rev. B*, vol. 47, No. 19, pp. 12727-12731 (May 15, 1993).

International Search Report and Written Opinion for PCT/US2004/040460, filed Dec. 2, 2004 (mailed Mar. 7, 2006).

Kiely, J.H. et al., "Characteristics of Bi$_{0.5}$Sb$_{1.5}$Te$_3$/Be$_2$Te$_{2.4}$Se$_{0.6}$ thin-film thermoelectric devices for power generation," *Meas. Sci. Technol.*, vol. 8, pp. 661-665 (Jun. 1997).

Martin, P. M. et al., "Si/SiGe Superlattices for Thermoelectric Applications" *Proceedings of the 46th Annual Technical Conference of the Society of Vacuum Coaters*, pp. 126-129 (2003).

Martin, P. M. et al., "Scale Up of Si/ Si$_{0.8}$Ge$_{0.2}$ and B$_4$C/B$_9$C Superlattices for Harvesting of Waste Heat," *Proceedings of DEER*, 6 pages (Aug. 24-28, 2003).

Martin, P. M. et al., "Recent Advances in Scale Up of Si/SiGe Superlattices for Thermoelectric Applications," Abstract Only, presented at the Functional Coating and Surface Engineering Conference 2003, Montreal, Canada, 3 pages (Jun. 4-7, 2003).

Martin, P. M. et al., "Nanostructured multilayer B$_4$C/B$_9$C and Si/Si$_{0.8}$Ge$_{0.2}$ films for advanced detector and thermoelectric applications," *Proceedings of 2004 AIMCAL Conference*, 7 pages (2004).

Martin, P. M. et al., "Superlattice Coatings for Device, Structural and Protective Applications," *Proceedings of AIMCAL 2006 Fall Technical Conference*, invited, 10 pages (2006).

Martin, P. M. et al., "Recent advances in magnetron sputtered superlattice and quantum well structures," *Proceedings of SPIE*, vol. 6403, pp. 640310-10-to 640310-11 (2006).

Martin, P. M. et al., "Magnetron-Sputtered Nanolaminate and Superlattice Coatings," *Proceedings of SPIE*, vol. 6403, pp. 640310-1 to 640310-9 (2006).

Nolas, G.S. et al., Thermoelectrics, "Basic Principles and New Materials Developments," Springer, Berline, pp. 111-146 (2001).

Office action from the U.S. Patent and Trademark Office in U.S. Appl. No. 10/726,744, dated Jun. 27, 2007.

Office action from the U.S. Patent and Trademark Office in U.S. Appl. No. 11/004,611, dated Jan. 7, 2008.

Office action from the U.S. Patent and Trademark Office in U.S. Appl. No. 10/727,062, dated Jun. 14, 2007.

Plachkova, S.K. et al., "Materials for Thermoelectric Application Based on the System GeTe-AgBiTe$_2$," *Physica Status Solidi (A)*, Abstract Only, vol. 184, Issue 1, pp. 195-200 (Mar. 2001).

Plachkova, S.K., "Thermoelectric figure of merit of the system (GeTe)$_{1-x}$(AgSbTe$_2$)$_x$," *Phys. Stat. Sol (A)*, Abstract Only, vol. 83, No. 1, pp. 349-356 (1984).

Plachkova, S.K., "Thermoelectric Power in the System $(GeTe)_{1-x}$ $(AgSbTe_2)_x$," *Phys. Status Solidi (A)*, Abstract Only, vol. 80, No. 1, pp. K97-K100 (Nov. 16, 1983).

Schaevitz, Samuel B. et al., "A Combustion-Based MEMS Thermoelectric Power Generator," The 11th International Conference on Solid-State Sensors and Actuators, Munich, Germany, 4 pages (Jun. 10-14, 2001).

Schmidt, F. et al., "Batterielose Funksensoren, betrieben mit Energie aus der Umgebung," 5 pages (Mar. 2002).

Sharp, J. W., "Some Properties of GeTe-Based Thermoelectric Alloys," *IEEE 22nd International Conference on Thermoelectrics*, pp. 267-270 (2003).

Stark, Ingo et al., "New Micro Thermoelectric Devices Based on Bismuth Telluride-Type Thin Solid Films," *18th International Conference on Thermoelectrics*, pp. 465-472 (1999).

Stölzer, M. et al., "Optimisation of p-$(Bi_{0.25}Sb_{0.75})_2Te_3$ and n-$Bi_2(Te_{0.9}Se_{0.1})_3$ Films for Thermoelectric Thin Film Components," *2nd Symposium on Thermoelectrics-Materials, Processing Techniques & Applications*, 5 pages (1994).

Stölzer, M. et al., "Preparation of Highly Effective p-$Bi_{2.5}Sb_{1.5}Te_3$ and n-$Bi_2Te_{2.7}Se_{0.3}$ Films," *15th International Conference on Thermoelectrics*, pp. 445-449 (1996).

Stordeur, Matthias et al., "Low Power Thermoelectric Generator—self-sufficient energy supply for micro systems," *16th International Conference on Thermoelectrics*, pp. 575-577 (1997).

Tritt, T., "Recent Trends in Thermoelectric Materials Research III," Academic Press, London, vol. 7, pp. 50-55 (2001).

Vasilevskiy, E. et al., "Texture formation in extruded rods of $(Bi,SB)_2(Te,Se)_3$ thermoelectric alloys," 21st International Conference on Thermoelectrics, Jet Propulsion Laboratory, California Institute of Technology, Massachusetts Institute of Technology (Aug. 26-29, 2002).

Venkatasubramanian, Rama et al., "Thin-film thermoelectric devices with high room-temperature figures of merit," *Nature*, vol. 413, pp. 597-602 (Oct. 11, 2001).

Vining, Cronin B., "Semiconductors are cool," *Nature*, vol. 413, pp. 577-578 (Oct. 11, 2001).

Yamanaka, S. et al., "Thermoelectric properties of $T_{19}BiTe_3$," *Journal of Alloys and Compounds*, vol. 352, pp. 275-278 (2003).

Thin-film Superlattice Thermoelectric Technology, www.rti.org, 4 pages (2002).

Physics of Thin Films: Sputter Deposition (Ohring: Chapter 3, sections 5-6), www.uccs.edu/~tchriste/courses/PHYS549/549lectures/sputter.html., 4 pages (Printed Nov. 21, 2002).

Physics of Thin Films: Sputter Deposition Techniques (Ohring: Chapter 3, section 7), www.uccs.edu/~tchriste/courses/PHYS549/549lectures/sputtertech.html., 5 pages (Printed Nov. 21, 2002).

Venkatasubramanian, R., "Thin-film Superlattice Thermoelectric Devices for Power Conversion and Cooling," www.its.org/its/ict2002/Abstracts/Rama_Venkatasubramanian.htm (Printed Sep. 26, 2003).

D.T.S. GmbH: Thin Film Thermoelectric Generators, D.T.S., www.dts-generator.com/index.htm (Printed May 4, 2004).

D.T.S. GmbH: Thin Film Thermoelectric Generators, Low Power Thermoelectric Generators; www.dts-generator.com/gen.txe.htm (Printed May 4, 2004).

D.T.S. GmbH: Thin Film Thermoelectric Generators, Infrared-Sensors, www.dts-generator.com/sen-txe.htm (Printed May 4, 2004).

D.T.S. GmbH: Thin Film Thermoelectric Generators, Research and development, www.dts-generator.com/dev-txe.htm (Printed May 4, 2004).

Office Action from the European Patent Office for European Patent Application No. 04822138.6, dated Feb. 11, 2009.

Office Action from the Japanese Patent Office for Japanese Patent Application No. 2006-542773, dated Feb. 23, 2009 (with translation).

Final Office action from the U.S. Patent and Trademark Office in U.S. Appl. No. 11/004,611, dated Mar. 4, 2010.

Office action from the U.S. Patent and Trademark Office in U.S. Appl. No. 10/726,744, dated Mar. 3, 2010.

Final Office action from the U.S. Patent and Trademark Office for U.S. Appl. No. 10/726,744, dated Feb. 29, 2008.

Notice of Allowance from the U.S. Patent and Trademark Office in U.S. Appl. No. 10/727,062, dated Jan. 11, 2010.

Böttner, H., "Thermoelectric Micro Devices: Current State, Recent Developments and Future Aspects for Technological Progress and Applications," *Proc. 21st Int. Conf. Thermoelectronics*, Long Beach, CA, pp. 511-518 (Aug. 25-29, 2002).

Final Office action from the U.S. Patent and Trademark Office for U.S. Appl. No. 10/726,744, dated Apr. 13, 2009.

Final Office action from the U.S. Patent and Trademark Office in U.S. Appl. No. 10/727,062, dated Jul. 20, 2009.

Kim, D.-H. et al., "Effect of deposition temperature on the structural and thermoelectric properties of bismuth telluride thin films grown by co-sputtering," *Thin Solid Films*, vol. 510, pp. 148-153 (Jul. 2006).

Nurnus, J. et al., "Structural and Thermoelectric Properties of $Bi_2Te_3$ Based Layered Structures," *Proc. 19th Int. Conf. Thermoelectrics*, Cardiff, U.K., pp. 236-240 (Aug. 25-29, 2000).

Office action from the U.S. Patent and Trademark Office in U.S. Appl. No. 11/004,611, dated Aug. 3, 2009.

Office action from the U.S. Patent and Trademark Office in U.S. Appl. No. 10/581,281, dated Apr. 30, 2009.

Sun, C.W. et al., "Crystallization behavior of non-stoichiometric Ge-Bi-Te ternary phase change materials for PRAM application," *J. Phys. Condens. Matter*, vol. 19, 446004, 9 pages (Sep. 2007).

Final Office action from the U.S. Patent and Trademark Office in U.S. Appl. No. 10/727,062, dated Jun. 16, 2008.

Office action from the U.S. Patent and Trademark Office in U.S. Appl. No. 10/726,744, dated Aug. 4, 2008.

Allinson, A.J. et al., "Microstrucural Changes in a Monostable Chalcogenide Switch Glass," *Journal of Non-Crystalline Solids*, vol. 31, No. 1, pp. 307-331 (Apr. 1, 1979).

Cook, A. B. et al., "Nature of the cubic to rhombohedral structural transformation in $(AgSbTe_2)_{12}(GeTe)_{85}$ thermoelectric material," *Journal of Applied Physics*, vol. 101, No. 5, pp. 053715-1-053715-6 (Mar. 14, 2007).

International Search Report and Written Opinion for PCT/US2008/074345, filed Aug. 26, 2008 (mailed Sep. 16, 2009).

International Search Report and Written Opinion for PCT/US2008/077748, filed Sep. 25, 2008 (mailed Sep. 22, 2009).

Office action from the U.S. Patent and Trademark Office in U.S. Appl. No. 10/726,744, dated Oct. 1, 2009.

Wagner, Andrew V. et al., "Sputter Deposition of Semiconductor Superlattices for the Thermoelectric Applications," *Mat. Res. Soc. Symp. Proc.*, vol. 450, pp. 467-472 (Dec. 2-5, 1996).

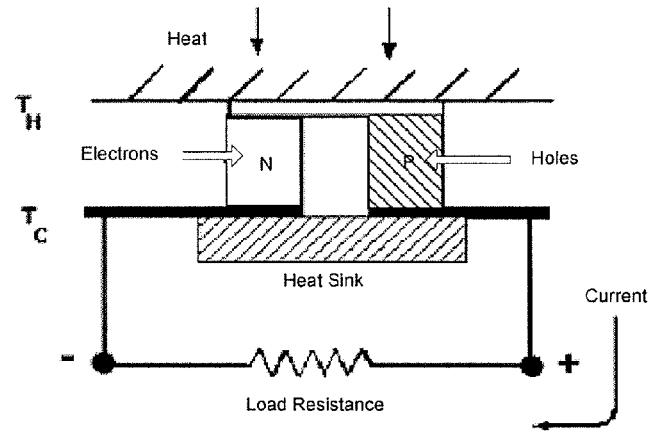
FIG. 1a
PRIOR ART
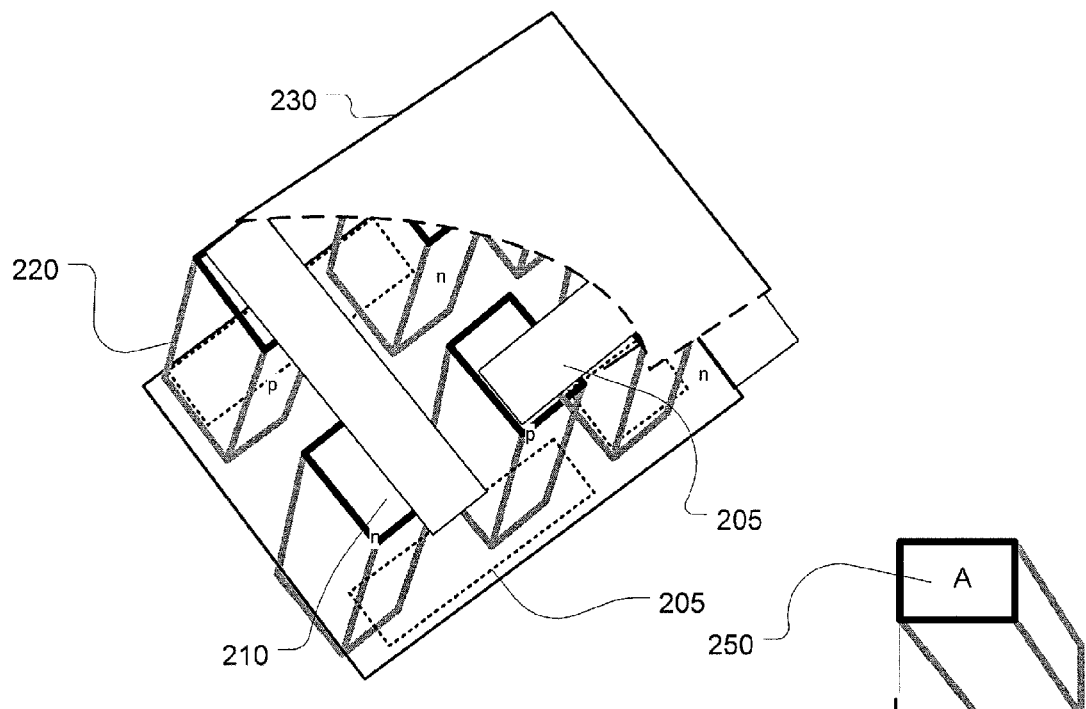
FIG. 1b
PRIOR ART
FIG. 1c
PRIOR ART

US 7,851,691 B2

THERMOELECTRIC DEVICES AND APPLICATIONS FOR THE SAME

CROSS-REFERENCES TO RELATED APPLICATIONS

The present application is a continuation-in-part of and claims priority from copending U.S. patent application Ser. No. 10/726,744, filed Dec. 2, 2003, and is also a continuation-in-part of and claims priority from copending U.S. patent application Ser. No. 10/727,062, filed Dec. 2, 2003, and claims the benefit of U.S. Provisional Patent Application No. 60/558,298, filed Mar. 30, 2004, all of which are hereby incorporated in their entireties by reference.

Copending U.S. patent application Ser. No. 11/864,877, entitled "Thermoelectric Devices" filed Sep. 28, 2007, copending U.S. patent application Ser. No. 10/581,281, filed May 31, 2006, copending U.S. patent application Ser. No. 11/004,611, filed Dec. 2, 2004, and PCT Application No. PCT/US2004/040460, filed Dec. 2, 2004, are hereby incorporated in their entirety by reference.

ACKNOWLEDGMENT OF GOVERNMENT SUPPORT

This invention was made with Government support under Contract DE-AC05-76RLO1830 awarded by the U.S. Department of Energy. The Government has certain rights in the invention.

FIELD

The present disclosure relates to thermoelectric devices, materials and methods of making and using the same to produce efficient thermoelectric devices.

BACKGROUND

The increasing use of portable electronics has driven research in the area of portable electric generators. Thermoelectric (TE) power sources have been found to be especially useful. TE power sources typically comprise three parts: a heat source, a heat sink, and a thermopile. The thermopile, consisting of a number of thermocouples connected in series, serves to convert some of the thermal energy into electrical energy. TE power sources generate electric power based on creating a thermal gradient across the thermocouples of the thermopile. The TE power source operates to convert the thermal energy to electric power by accepting thermal energy on a "hot" side or junction, passing it through the thermopile and rejecting heat to a "cold" side or junction.

Certain TE power sources and TE thermocouples in particular are formed using semiconductor materials. Semiconductor materials with dissimilar characteristics are connected electrically in series (to form thermocouples) and thermally in parallel, so that two junctions are created. The semiconductor materials are typically n-type and p-type. In a typical thermoelectric device, the electrically conductive connection is formed between the p-type and n-type semiconductor materials. These materials are so named because of their structure: the n-type has more electrons than necessary to complete a perfect molecular lattice structure while the p-type does not have enough electrons to complete a lattice structure. The extra electrons in the n-type material and the holes left in the p-type material are called "carriers." The carriers are driven from the hot junction to the cold junction as a result of thermal diffusion resulting in an electrical current.

For thermoelectric cooling, the electrons and holes transport heat as a result of imposed electrical current. Prior art FIG. 1a illustrates a form of such power conversion. Cooling action results from reversing the process.

A semiconductor TE device's performance is limited by the non-dimensional thermoelectric figure of merit (ZT) of the material, where T is the absolute temperature and Z is the thermoelectric figure of merit, $Z=sa^2/k$ (a-thermoelectric power, s-electrical conductivity, k-thermal conductivity). Typically TE devices are preferably formed of TE materials having relatively high thermoelectric figures of merit. In certain devices, however, the key objective is to produce power at voltages above 1.0 V in as small or compact a device as possible. The known TE materials having relatively high thermoelectric figures of merit cannot be deposited as thin films on substrates useful for forming small TE power source devices. Thus, although more efficient materials (i.e., materials with high ZT values) are typically better, for many applications it is more important that the resulting device be formed on a flexible substrate. As a result, although there may be some sacrifice of ZT value, using a TE material depositable on a substrate that allows fabrication of a small device with a relatively high voltage (without the need for a dc-dc converter) is better for certain applications. Unfortunately no such materials and methods are yet available.

Devices having ZT values of greater than 2.0 have been reported for Bi—Te/Sb—Te superlattices grown on single crystal GaAs. Such devices are not, however, suitable for many applications where hundreds or thousands of elements must be placed in a relatively small package.

Despite the potential and promise of TE devices, existing TE power sources have limited efficiency and electric potential when relatively small devices are made. Conventional semiconductor deposition techniques for making TE devices, such as electrochemical deposition, are not well suited for building optimally designed TE power sources. Difficult syntheses have limited the construction of many TE devices to bulk materials or minute quantities—each suffering from shortcomings in size or performance.

For example, currently available TE modules have structures similar to that depicted in prior art FIG. 1b, with each distinct thermoelement typically having a length and width on the order of a few millimeters. Such modules are described, for example, in U.S. Pat. No. 6,388,185 and C. B. Vining, Nature 413:577 (Oct. 11, 2001). These modules cannot provide voltages that readily match the input requirements of many devices, including power conditioning electronics.

A practical approach to building high-voltage, thin-film TE devices capable of microwatt power output in relatively small packages is needed. In addition, TE devices using a temperature gradient of about 10° C. or less would be helpful as well as TE devices operating at or near ambient temperatures. A number of applications require TE devices that operate at such temperatures and/or on such temperature gradients. For example, sensors used for building climate control or for other applications such as military applications where ambient energy is utilized if possible, operate on only 5 to 20° C. temperature differences.

SUMMARY

A key parameter affecting the voltage produced by TE modules (also referred to herein as couples or thermocouples) is the length-to-area (L/A) ratio of the individual thermoelements, where A is the cross sectional area of a thermoelement. Current monolithic (or discrete element) modules are characterized by L/A values of less than about 20 cm$^{-1}$. Although some superlattice TE devices have been proposed that have L/A values that are much higher than the current monolithic devices, the superlattice TE devices suffer other shortcomings. Current superlattice TE devices have been proposed to comprise a n-type superlattice structure having alternating layers of 50 Å in thickness with individual n-type elements being about 0.0001 cm in total thickness. Although superlattice TEs are relatively efficient with relatively high Seebeck coefficients, there is no superlattice TE technology where films are depositable on flexible substrates. Currently, all superlattice materials are deposited on single crystals; the films are grown on GaAs substrates and then are removed and applied to another substrate. Thus, superlattice TEs are not typically useful for applications requiring small or compact TE devices.

Accordingly, disclosed are thin film thermoelectric (TE) modules and power sources. Certain embodiments of the disclosed thin film TE modules and power sources have relatively large L/A ratio values, greater than about 20 cm$^{-1}$ and perhaps more typically greater than about 100 cm$^{-1}$. Certain embodiments of the disclosed thin film TE modules and power sources have even larger L/A ratio values, for example up to about 1,000 to about 10,000 cm$^{-1}$ or greater. The L/A ratio values of certain embodiments of the disclosed TE power sources allow fabrication of μW to W power supplies providing voltages greater than 1 volt even when activated by relatively small temperature differences, such as 20° C. or 10° C., and certain embodiments even at temperature differences as small as about 5° C. The size of the disclosed TE power sources are relatively small—having volumes in the range of one to ten cm$^3$—much smaller than existing devices that operate in the 1 μW to 1 W range, and certain embodiments provide voltages of greater than 1 V.

More specifically, certain embodiments of the disclosed TE power sources comprise, in part, arrays of TE couples having multiple thermoelements (e.g., an n-type and a p-type thermoelement pair). The thermoelements are formed of sputter deposited thin films of $Bi_xTe_y$, $Sb_xTe_y$, and $Bi_xSe_y$ alloys where x is typically about 2 and y is typically about 3. The thermoelements form the modules (thermocouples) for converting thermal energy to electrical energy. Such thermoelements typically comprise thin films of TE materials having L/A ratios greater than about 500 cm$^{-1}$. The devices include modules where thin films of p-type and n-type TE materials are deposited, e.g., on a suitable flexible substrate and are electrically connected to one another in series or in series-parallel.

In another embodiment, the disclosed TE power sources comprise, in part, arrays of TE couples having multiple thermoelements of n-type or p-type, or n-type and p-type thermoelement pairs with thermoelements formed of sputter deposited thin films containing various proportions of germanium (Ge), silver (Ag), antimony (Sb) and tellurium (Te) as p-type material and Ag, Pb and Te as n-type material. The above materials may be referred to herein as GAST or GAST materials. GAST materials can be distinguished from known thermoelectric materials of the form $(AgSbTe_2)_{1-x}(GeTe)_x$ p-type and $Ag_xPbTe$ n-type bulk materials, as GAST materials are sputter deposited thin films having no single or specific value of the compositional fractions (1-x) and x. In contrast, the disclosed p-type GAST materials may be achieved by sputter deposition of thin films with compositions in the following ranges:

Ge—Trace amount to about 25 Atomic %
Ag—Trace amount to about 10 Atomic %
Sb—Trace amount to about 20 Atomic %
Te—about 60 to 90 Atomic %

Useful n-type GAST materials may be achieved by sputter deposition of thin films with compositions in the following ranges:

Ag—Trace amount to about 10 Atomic %
Pb—about 35 to about 55 Atomic %
Te—about 40 to about 60 Atomic %

Embodiments of the TE power sources comprise multiple TE modules, a hot junction (or heat source) and a cold junction (some mechanism for removing heat). The TE power source may additionally include one or more ceramic plates or a ceramic-coated metallic shoe or the like.

Novel methods of constructing such TE elements, modules and devices, including sputter deposition of $Bi_xTe_y$, $Sb_xTe_y$, and $Bi_xSe_y$ (where x is typically about 2 and y is typically about 3) or GAST p-type thin films and GAST n-type thin films and the use of templates are also disclosed. The p-type and n-type sputter deposited materials may be connected by suitable connections such as metallic bridges, e.g., Cr, Ni, Au or Ag, or combinations thereof. The process may be used to deposit n-type and/or p-type films that exhibit useful TE properties. In addition, in certain embodiments, electrically conductive material connecting the thermoelements of the module are sputter deposited as well. When deposited onto flexible substrates, such films find many practical uses where a TE module of almost any configuration is required.

Further embodiments of the disclosed methods include a method of making a thermoelectric power source comprising: (a) providing a flexible substrate having an upper surface; (b) forming a thermoelectric couple by (i) sputter depositing a thin film of p-type material comprising Ge, Ag, Sb, and Te to form at least one thermoelement on the upper surface of the flexible substrate and (ii) sputter depositing a thin film of an n-type material to form at least one thermoelement positioned on the upper surface of the flexible substrate adjacent the p-type thermoelement; and (iii) forming an electrically conductive member thereby electrically connecting the first end of the p-type thermoelement in electrical contact with the second end of the n-type thermoelement.

Other methods disclosed include making thermoelectric power sources by sputter depositing p-type thermoelements comprising about 14 atomic percent Ge, about 2 atomic percent Ag, about 6 atomic percent Sb and about 78 atomic percent Te.

Other disclosed embodiments include methods of forming a thermoelectric power source by forming at least about 500 thermocouples and electrically connecting the thermocouples to one another on an upper surface of a flexible substrate, the forming of the thermocouples comprising sputter depositing thin films of GAST p-type material forming p-type thermoelements, sputter depositing thin films of n-type material forming n-type thermoelements alternatingly positioned adjacent the p-type thermoelements, and forming the thermoelectric power source such that it occupies a volume of less than about 10 cm$^3$ and has a power output of at least about 50 μW.

BRIEF DESCRIPTION OF THE DRAWINGS

FIG. 1a is a representation of a prior art illustration of a basic approach to thermoelectric energy conversion.

FIG. 1b is a diagram showing a prior art arrangement of discrete TE elements.

FIG. 1c is a representation illustrating the L/A ratio parameters for a single prior art TE element as shown in the device of FIG. 1b.

FIG. 2b illustrates the L/A ratio parameters for a single p-type thin film TE element of the embodiment of the module illustrated in FIG. 2a.

FIG. 9b illustrates representative dimensions of thermoelements in the embodiment of the TE thin film modules depicted in FIG. 9a.

DETAILED DESCRIPTION

Disclosed are TE modules wherein certain embodiments comprise pairs of sputter deposited thin film thermoelements and electrically conductive members connecting the thermoelements to one another in series or in series-parallel. Also disclosed are TE power source devices formed of multiple TE couples such as arrays of TE couples wherein the thin film thermoelements have an L/A ratio of greater than at least about 20 $cm^{-1}$ or greater than about 100 $cm^{-1}$ with certain embodiments having an L/A ratio of greater than 1000, 10,000 and even higher for devices operating at a lower power application, such as at or below about 1 Watt. For power level applications greater than about 1 Watt the thin film thermoelements have an L/A ratio of greater than at least about 1 $cm^{-1}$.

Unless otherwise indicated, all numbers expressing quantities of ingredients, properties such as L and A values, thicknesses, power levels, and so forth used in the specification and claims are to be understood as being modified by the term "about" whether explicitly stated or not. Accordingly, unless indicated clearly to the contrary, the numerical parameters set forth are approximations.

Figure 2A:
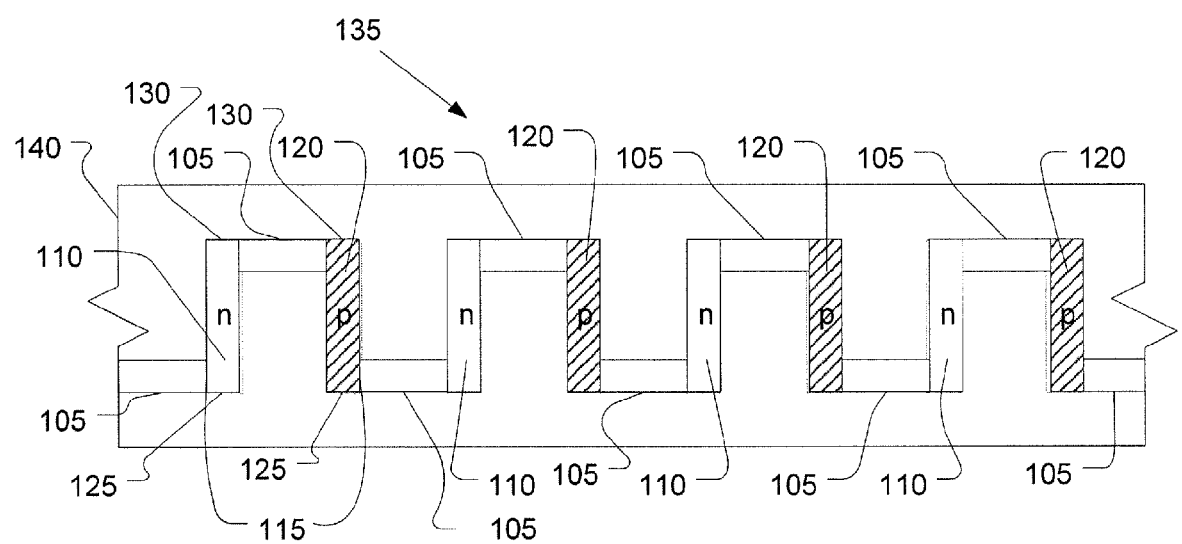
FIG. 2a illustrates a portion of an embodiment of the disclosed n-type/p-type TE thin film modules.

One embodiment of multiple thin film TE modules 115 utilized to form the disclosed TE power source 100 (see e.g., FIG. 4) is shown in FIG. 2a. FIG. 2a depicts a portion 135 of the TE power source 100, the portion 135 comprising the multiple TE modules 115 formed on a substrate 140. The TE modules 115 comprise pairs of n-type thermoelements 110 and p-type thermoelements 120 formed of semiconductor thin films.

Figure 14:
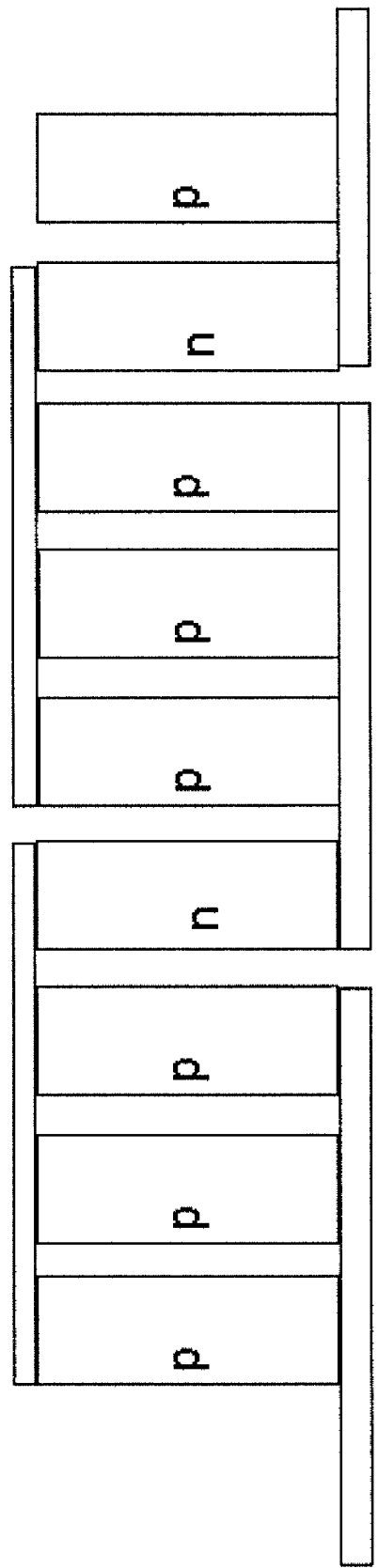
FIG. 14 shows an embodiment of the disclosed n-type and p-type TE thin films deposited on a flexible substrate wherein the n-type and p-type TE thin films are connected in a series-parallel arrangement.
Figure 15:
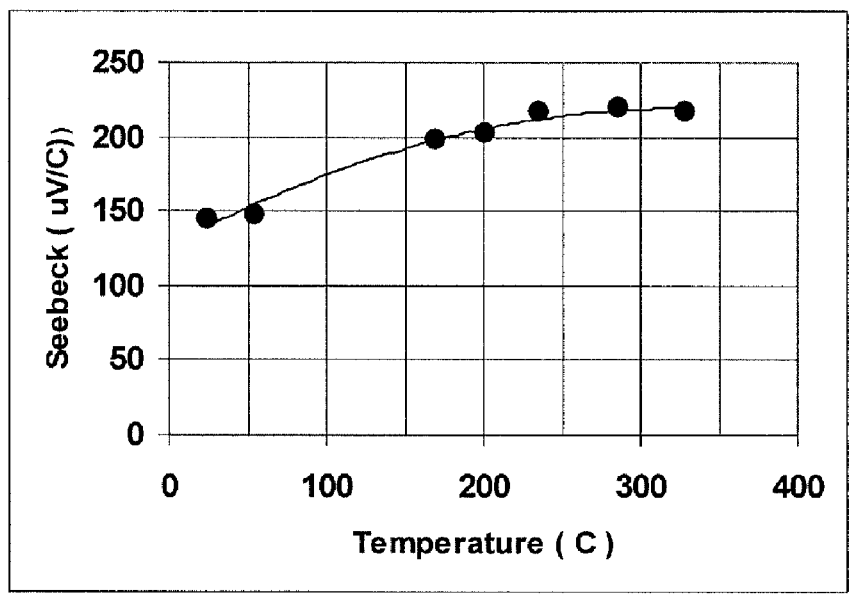
FIG. 15 is a graph showing the temperature dependence of the Seebeck coefficient of GAST thin films.

Alternating n-type and p-type thermoelements 110, 120 of the TE modules 115 may be positioned parallel to one another as shown in FIG. 2a, in series-parallel as shown in FIG. 14, or may be placed in other suitable fashions (as mentioned below). Electrical connection (through electrically conductive member 105) of one n-type thermoelement 110 with one p-type element 120 forms a complete, single TE module 115 (also referred to as a thermocouple or a couple). Electrically conductive members 105 connect the n-type thermoelements 110 to p-type thermoelements 120, for example, alternately at adjacent thermoelement first ends 125 and adjacent thermoelement second ends 130 (as shown in FIG. 2a).

Figure 3:
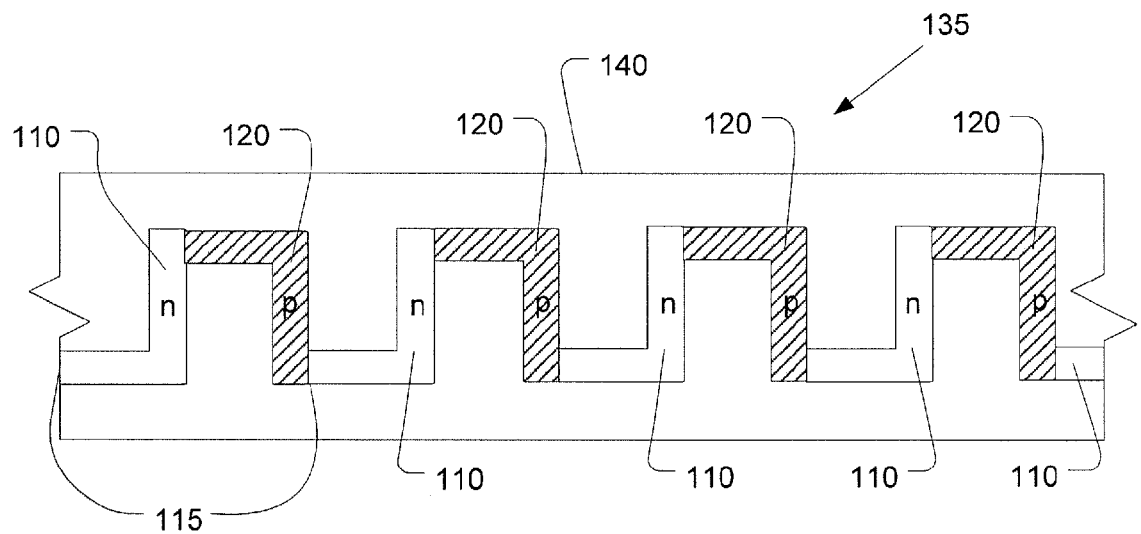
FIG. 3 illustrates a portion of an embodiment of the disclosed n-type/p-type TE thin film modules.

The electrically conductive members 105 may be substantially perpendicular to the elements 110, 120 or may be positioned in any suitable manner so as to electrically connect the thermoelements in series or in series parallel. In another possible configuration, there may be no separate electrically conductive members but instead the TE p-type and n-type alternating elements may be connected directly to one another, as for example shown in FIG. 3. Such a device would reduce the number of deposition steps required to form the TE module. For example, in another embodiment the n-type and/or p-type materials may be placed at angles to one another, connecting at alternating ends so that they come together at the hot and cold ends—forming a zigzag type configuration. In another possible alternative embodiment electrically conductive members are formed of the n-type or p-type elements themselves and are positioned as shown in FIG. 3. Clearly the individual TE elements and the array of TE elements making up a module may take a myriad of configurations.

The TE modules 115 may be formed on a flexible or a rigid substrate 140.

A TE power source 100 may include any number of TE couples 115 depending upon the application of the power source. Certain TE power sources comprise, e.g., from about 50 to 20,000 TE modules 115 depending on the environment and application as well as desired power output. As a specific example application, a TE power source 100 used to power a temperature sensor or used to power a wireless transmitting device, with a power of 50 μW at 1.0 V, might utilize 600 to 800 n-p thermocouples (TE modules 115) with each TE element being about 1 cm long, 0.1 cm wide and 0.0001 cm in thickness. A nuclear TE power source designed to provide 100 mW at 1.0 V would potentially involve the same number of thermocouples, but the elements would more likely be about 0.2 cm in length, 1 cm wide and 0.0040 cm in thickness. The voltage required of the TE power source determines the number of thermocouples (TE modules) necessary and the desirable current determines the necessary L/A ratio of the thermoelements. In general, embodiments of power sources formed using GAST materials have similar performance as the bismuth telluride examples discussed herein except that, because the GAST devices will have higher ZT values, GAST TE devices will produce the same power with fewer TE modules for operation in the same temperature range or will produce more power using the same number of TE modules in the same volume as compared to the examples discussed above. GAST materials are more efficient at higher temperatures, e.g., about 150 C to 350 C. For low power applications with a temperature difference of about 10 or 20 C, the performance of GAST materials is similar to the BiTe materials.

Figure 4:
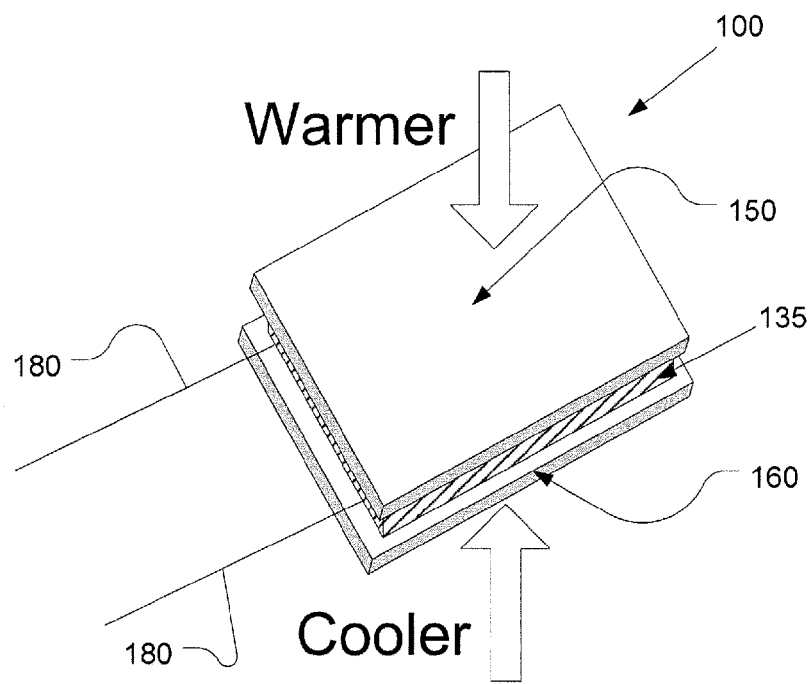
FIG. 4 illustrates an embodiment of the disclosed TE power source.
Figure 7:
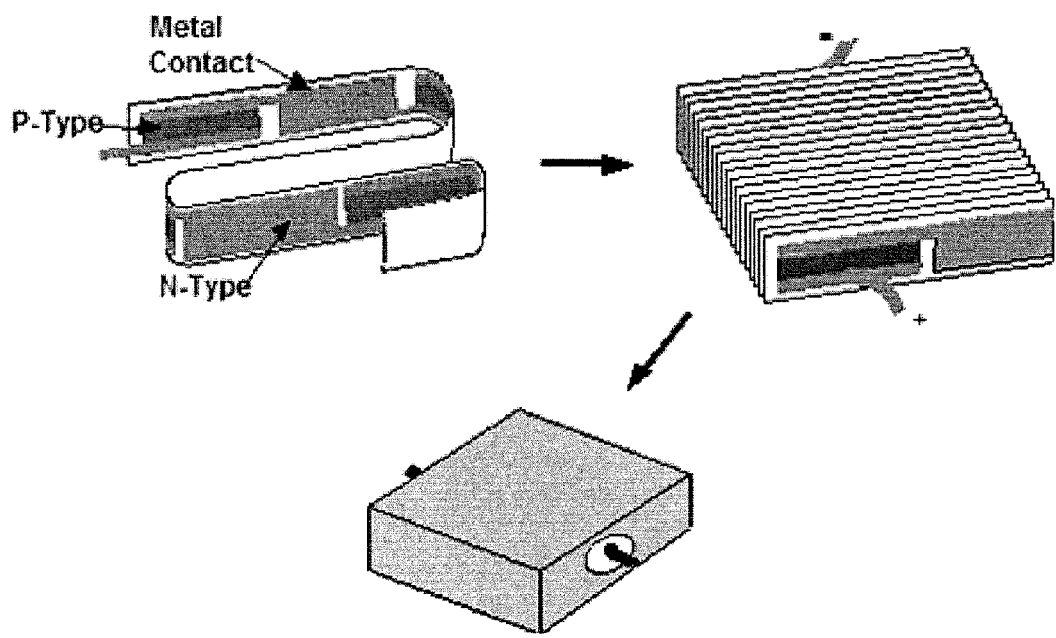
FIG. 7 illustrates an embodiment of the disclosed power source wherein arrays of TE thin film modules, such as those of FIG. 2a, FIG. 3, FIG. 6 or modules with relatively wider thermoelements are folded in an accordion configuration.
Figure 8:
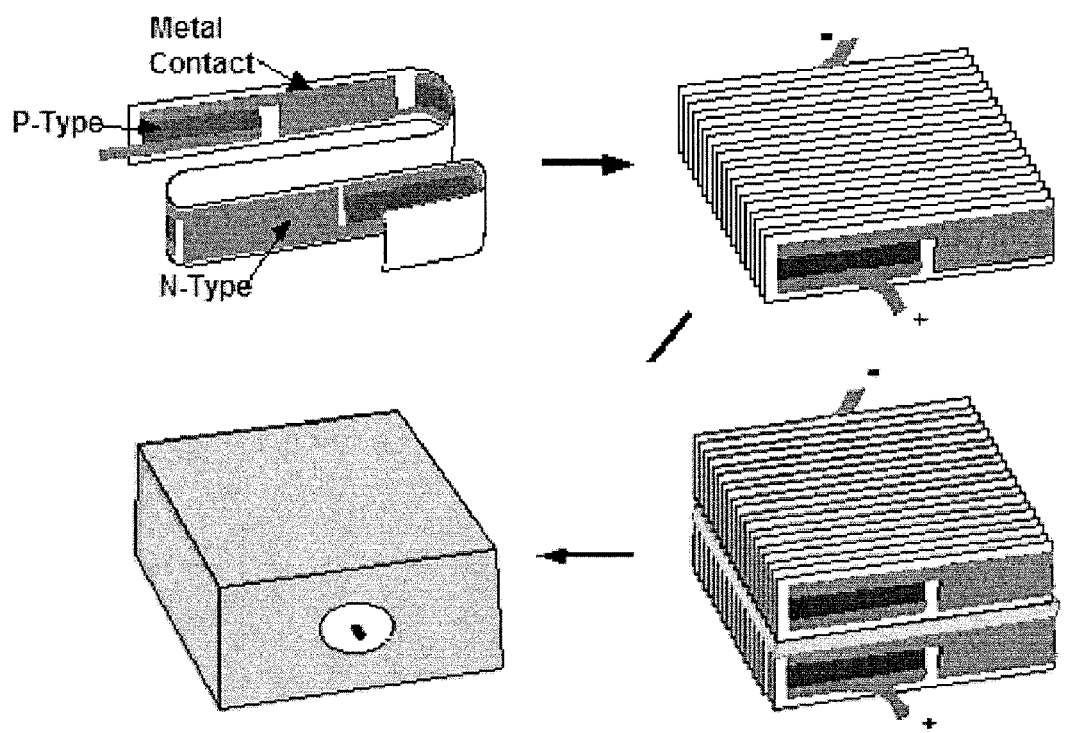
FIG. 8 illustrates an embodiment of the disclosed power source device wherein a nuclear heat source is positioned between arrays of TE thin film modules folded in an accordion configuration.

Possible embodiments of a complete TE power source 100 are shown in FIGS. 4, 7 and 8. In addition to the array of TE modules 135, the TE power source may comprise thermally conductive plates 150, 160, such as ceramic plates on the upper and lower edges of the substrate 140 (as shown in FIG. 4), a single ceramic plate, a ceramic shoe or other suitable enclosure devices. Electrical leads 180 are connected to the array of TE couples 135 of the TE device 100 to receive and transmit the electrical energy produced by the device.

The embodiment of the thin film TE power source 100 may further comprise a hot junction (or heat source) and a cold junction. The hot junction or heat source may comprise any suitable source depending upon the application of the device, for example a chemical energy source, heat from the environment, or a nuclear heat source as shown in FIG. 8. The cold junction may comprise any suitable heat removal mechanism constructed or positioned in a manner that allows heat to be relieved from or extracted from the TE power source. For example, the cold junction may comprise a heat pipe arrangement or exposure to the environment by, e.g., convection cooling.

Figure 5:
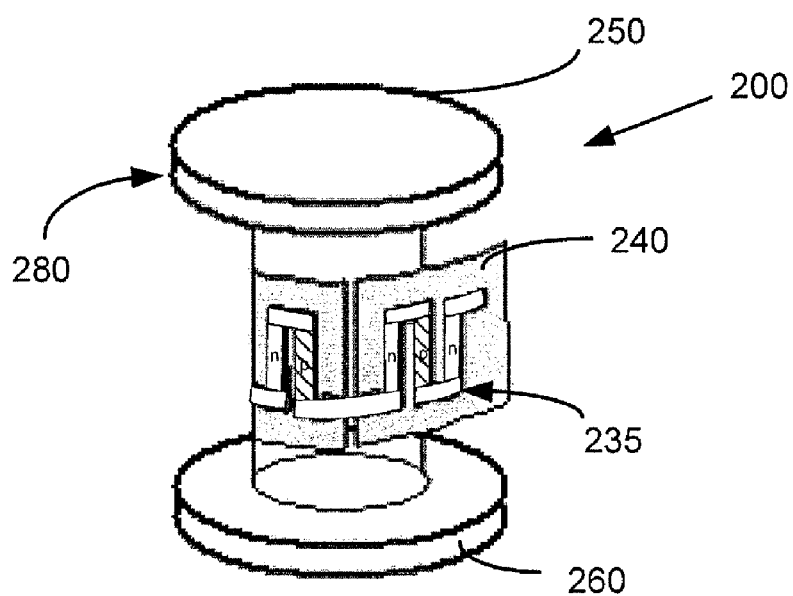
FIG. 5 illustrates an embodiment the disclosed TE power source in which TE thin film modules, such as those illustrated by FIG. 6, are wound about a spindle.
Figure 6:
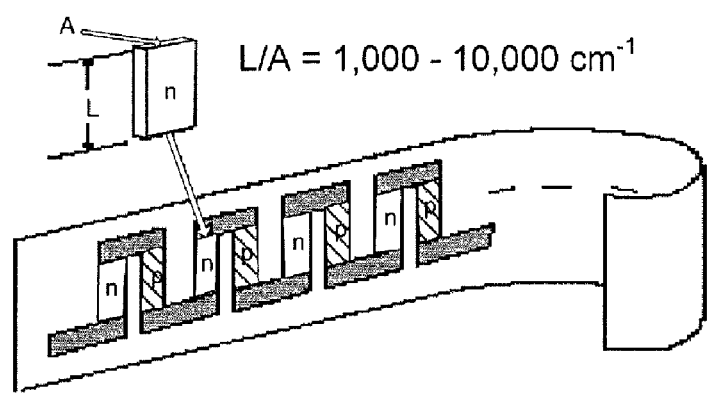
FIG. 6 illustrates an embodiment of the disclosed n-type/p-type TE thin film modules as deposited on a flexible substrate.

In another particular embodiment the TE power source 200 comprises multiple TE thermoelements forming an array of modules 235 deposited on a flexible substrate 240 (FIG. 5). The array of couples 235 is wound in a coil like fashion and positioned between hot and cold junctions 250 and 260. The array module 235 may simply form a coil or may be wound about an apparatus such as a spindle 280. Such a configuration provides an even smaller TE power source without sacrificing power output.

If a TE power source application requires relatively large currents, the internal resistance of the TE array is preferably made to be relatively low. To do so may involve forming thermoelement films that have relatively low values of L/A. To create films with lower L/A values, relatively wide thermoelements may be deposited and used. The TE power source depicted in FIGS. 7 and 8 may utilize thin film thermoelements having relatively large widths deposited on a flexible substrate such as polyimide tape. The TE module array may then be configured in an accordion-like arrangement and packaged with appropriate feedthroughs, as shown in FIGS. 7 and 8.

The current density of TE power sources as disclosed herein will depend on the total number of thermoelements, and the L and A values for the thermoelements. Put another way, if particular current densities are desirable for a particular TE power source, the number of thermoelements and L and A values may be manipulated to meet such requirements. Referring to an embodiment configured as shown in FIG. 3, if the thermoelements were deposited to have an L value of 1 cm, a width of 0.1 cm and a film thickness of 0.0001 cm, a $Bi_xTe_y$, $Sb_xTe_y$, and $Bi_xSe_y$ TE power source based on about 500 of such thermoelements would produce 10 micro amps, whereas with wider thermoelements such as discussed in relation to and illustrated in FIGS. 7 and 8, a current of 100 milliamps could be produced. With either such embodiments, a current density of about 1 Amp/cm$^2$ would flow. Note that the current and voltage (and power) produced by a battery or sensor depends on the hot and cold junction temperatures, and temperature difference.

Thin Film TE Thermoelements

The TE thermoelements, although depicted in most of the figures as rectangular in shape, may take any suitable shape. Clearly, with rectangular-shaped thermoelements the dimensions may also be varied depending upon the ultimate application of the resulting TE power source being fabricated. For example, the dimensions of the individual thermoelements length, width, and thickness as well as the number of elements and the array configuration may all be changed (see, e.g., FIGS. 9a and 9b). The resistivity of the n-type and p-type materials may be different, so if one desires to minimize the total resistance, the L/A ratios can be manipulated. In addition, the p-type thermoelements may have different dimensions, such as different widths, than those dimensions of the n-type elements. Furthermore, for thermoelements of widths too great to be easily folded or coiled on a flexible substrate, the thermoelements may be broken up into separate pieces positioned in parallel to one another and in series with the opposite type thermoelements, such as, for example, the configuration shown in FIG. 14 (i.e., in series-parallel configurations).

One group of thermoelectric materials for power generation in the 0° C. to the 100° C. temperature range are semiconductors and related alloys based on $Bi_xTe_y$, $Sb_xTe_y$, and $Bi_xSe_y$ where x is typically about 2 and y is typically about 3. The values of x and y may vary depending upon the power supplied to the sputter deposition targets (or equivalently the flux coming from each target). Such thin film thermoelement materials can be sputtered onto a variety of substrates, such as very useful flexible substrates (e.g., polyimide films such as those currently manufactured by the DuPont Corporation under the KAPTON trademark) which allow for fabricating very compact TE power sources.

The $Bi_xTe_y$, $Sb_xTe_y$, and $Bi_xSe_y$ or GAST films forming the thermoelements 110, 120 may vary in thickness, but certain embodiments of the disclosed $Bi_xTe_y$, $Sb_xTe_y$, and $Bi_xSe_y$ TE devices include thermoelements having thicknesses of at least 0.1 micrometer. The CAST films forming the thermoelements 110, 120 may vary in thickness, but certain embodiments of the disclosed TE devices include thermoelements having thicknesses of at least about 0.1 micrometer. The desirable thickness depends on the ultimate application of the TE power source being fabricated. In addition, the thickness variation will depend on the sputtering system arrangement, but typically fall within +/−5%.

The thermoelements 110, 120 may vary in area but certain embodiments of the disclosed TE devices include thermoelements having an L/A ratio of greater than about 50 cm$^{-1}$. Of course, as mentioned above, the L and A values and/or other dimensions of the thermoelements may be varied as desired according to the desired application of the resulting TE device. The range for the L, A and thickness values depend on the power requirements of the ultimate TE power source being made. If it is desirable to have a power source having a voltage of 1.0 or 2.0 volts, then the choice of L/A values depends on the current requirements. For example, in the first two specific embodiments described above, the L/A value for a TE power source for a sensor are 100,000 and for a nuclear battery the L/A ratio are 50. The third specific embodiment involves an array of TE thermoelement modules having an L/A value about in the range of prior art discrete elements.

An advantage of the present methods for fabricating TE thermoelements is that the thermoelements are being sputter deposited and thus are more controllable and easily manipulated than are thermoelements made by standard approaches involving the growth of crystalline boules followed by cutting. Such prior approaches to defining the thermoelement L/A ratios are impractical on a small scale, let alone on a commercial scale. The templates used in the deposition of the thermoelement thin films are simply varied accordingly; see, for example, FIGS. 12a-12c.

Sputter deposited thin films based on superlattice structures can also be used to fabricate the thermoelectric power sources. Each n-type and p-type film could consist of a multilayer film structure with the individual layers being approximately 10 Å to 200 Å thick, and the total film thickness varying as described for the homogeneous films described herein. For example, and not meant to be limiting, a n-type superlattice film might consist of alternating $Bi_2Te_3$ and $Sb_2Te_3$ layers with thicknesses of 50 Å and 150 Å, respectively, which are deposited at ambient conditions. A p-type superlattice structure may involve a similar structure, but grown with a different substrate temperature. These film structures can have larger values of electrical conductivity and Seebeck coefficient, and lower values of thermal conductivity, all of which allow improved power source efficiency.

TE devices utilizing thin films of GAST may operate for power generation in environments from the 0° C. to 600° C. range or even below freezing temperature ranges. TE devices operating in the 0° C. to 600° C. range can be met utilizing semiconductors and related alloys based on GAST p-type sputter deposited thin films and n-type thin films with compositions in the ranges shown previously. As mentioned, the disclosed GAST TE devices could operate in other temperature ranges as well, for example, the devices could operate in very cold environments such as at a temperature range of from about −60° C. to about +30° C.

Certain bulk formed $(AgSbTe_2)_{1-x}(GeTe)_x$ material TE devices have been disclosed, however those materials and devices made using those materials that differ significantly from the sputter deposited materials disclosed herein. Prior $(AgSbTe_2)$ (GeTe) materials were made using bulk methods that produced compositions of the form $(AgSbTe_2)_{1-x}(GeTe)_x$ which differ from the GAST materials disclosed herein (although having the same elemental components, the components are present in different amounts resulting in materials having very different thermoelectric characteristics). Bulk formed $(AgSbTe_2)$ (GeTe) compounds are typically synthesized by hot pressing, and casting techniques. The bulk materials are fabricated by mixing powders of the components according to the formula $(AgSbTe_2)$ (GeTe).

The GAST sputter deposited materials, in contrast to the bulk methods, do not have compositions determined by assuming a simple mixture of powders or even by the sputter deposition targets' compositions. Each element sputters at a different rate depending upon the operation parameters as well as the composition of the target. Certain embodiments of the sputter deposited combinations of GAST thin film materials utilize methods of co-sputtering from separate targets onto a flexible substrate such as polyimide or other suitable insulating substrate. The disclosed methods produce favorably-oriented, nano-structured material combinations that are both different from and superior to $(AgSbTe_2)_{1-x}(GeTe)_x$ bulk TE materials fabricated by conventional means. For example, the GAST materials possess (as described above) compositional ranges for each constituent that vary over ranges that exceed the 1−x versus x relationship of the known $(AgSbTe_2)_{1-x}(GeTe)_x$ bulk TE materials.

A substrate will provide a supporting "scaffold" that allows manipulation and application of thermoelectric (TE) sputter deposited films that are typically as thin as one to tens of micrometers with areas of up to a square meter or more. Without the support provided by the substrate, handling and incorporating such large-area but ultra-thin GAST films into working thermoelectric converters would be impractical. The GAST materials can be formed on a flexible substrate; the substrate may become a part of the actual TE device. A flexible substrate enables a spooled TE device configuration. In addition, the substrate preferably has negligible impact on the thermal efficiency of the deposited TE film because the thermal conductivity of the substrate is preferably about an order of magnitude lower than that of the TE material it supports. The substrate is also preferably an electrical insulator, so it does not significantly affect the Seebeck coefficient or the electrical conductivity of the thin-film GAST deposit.

GAST materials sputtering methods (and other vacuum processes) are non-equilibrium processes. In bulk material processes the material must reach thermodynamic equilibrium. In addition, because the thin films of GAST materials are sputter deposited, the thin films are formed an atom at a time. Atoms of the composite material arrive and deposit sequentially from a plasma phase. Bulk materials are mixed as powders then pressed and possibly sintered into a block or slab. This approach allows considerable freedom to achieve materials having properties not achievable with bulk materials. For example, the thermal conductivity of the material depends significantly on the microstructure of the deposited CAST film and the resulting microstructure depends on the sputtering gas pressure and the substrate temperature. Through sputter deposition of the disclosed GAST thin films, virtually any composition can be synthesized when co-sputtering multiple target materials and varying the sputter deposition parameters. Changing parameters and conditions, including the chamber pressure, the substrate temperature, the deposition rate, and the reactive gas (if used) pressure will determine the exact GAST composition formed.

Variation of these parameters allows the fabrication of GAST thin films having desirable thermoelectric, electric and thermal properties. Periodic variation of the deposited material composition and microstructure is virtually impossible with bulk materials but readily obtained using sputtering techniques.

Figure 20:
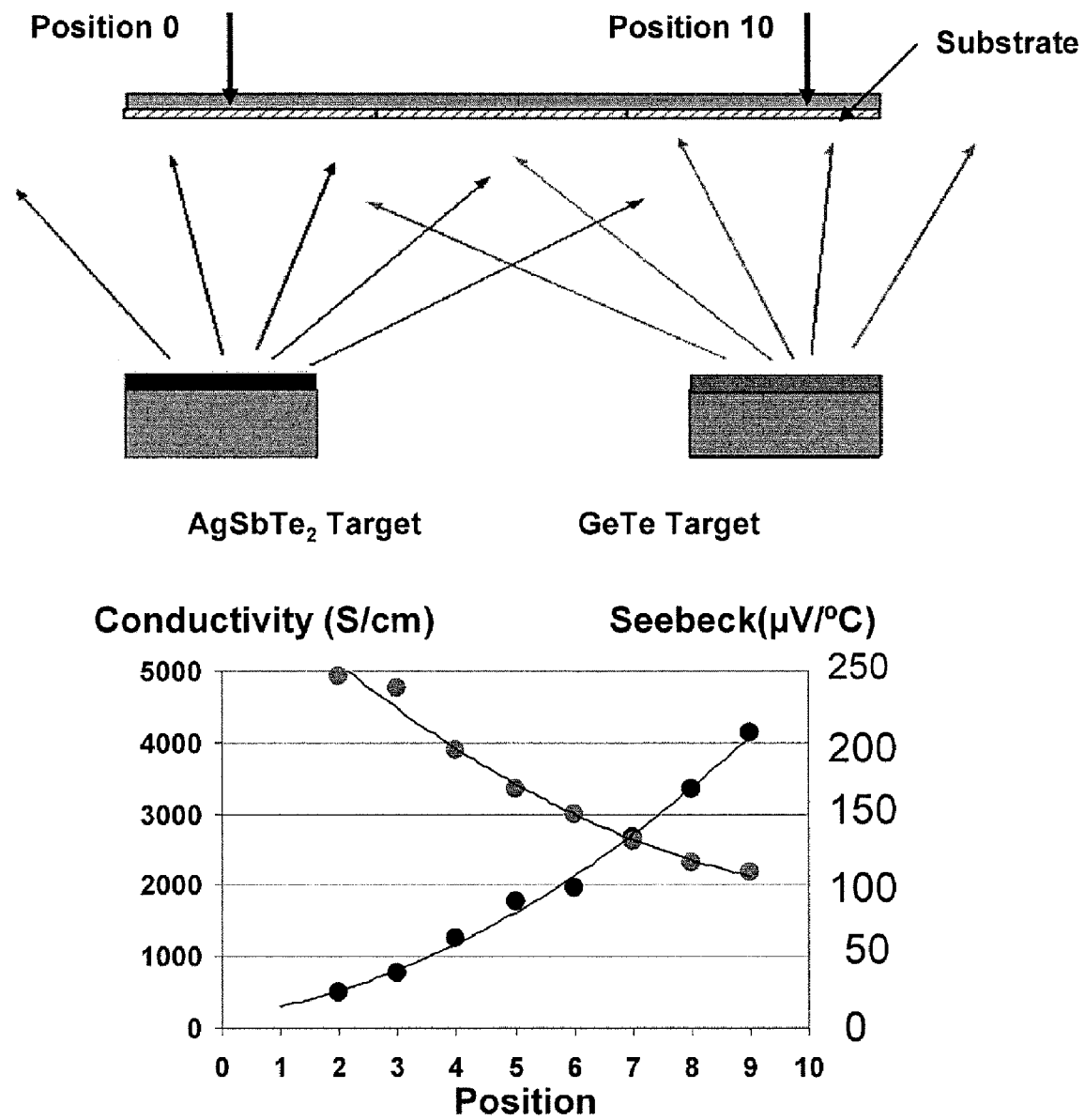
FIG. 20 illustrates how electrical conductivity and Seebeck coefficient vary along a three inch substrate held at 330° C. and placed five inches above three inch targets of $AgSbTe_2$ and GeTe. RF power of 60 W and DC power of 165 W were applied to the $AgSbTe_2$ and GeTe targets, respectively and the set up for measuring the same. The Seebeck coefficient and electrical conductivity were measured at 25° C.

For example, with sputtering, components of GAST films can be compositionally varied by co-sputtering from AgSbTe2 and GeTe targets. FIG. 20 illustrates how the electrical conductivity and the Seebeck coefficient vary as the film composition changes from one end of a substrate to the other when placed in positions as shown in FIG. 20. Compositional variation is achieved by adjusting the power input to the sputtering targets or by placement of the substrate above the targets.

Figure 16:
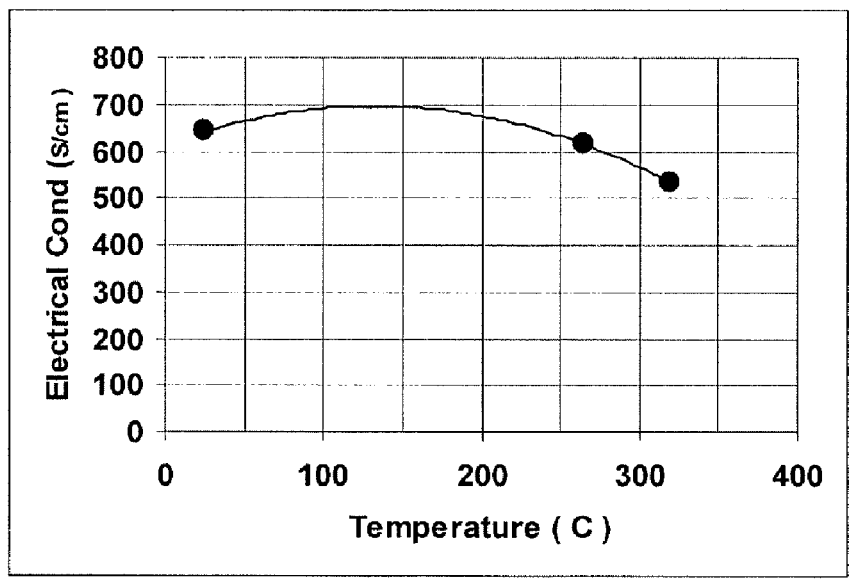
FIG. 16 is a graph showing the temperature dependence of the electrical conductivity coefficient of GAST thin films.
Figure 17:
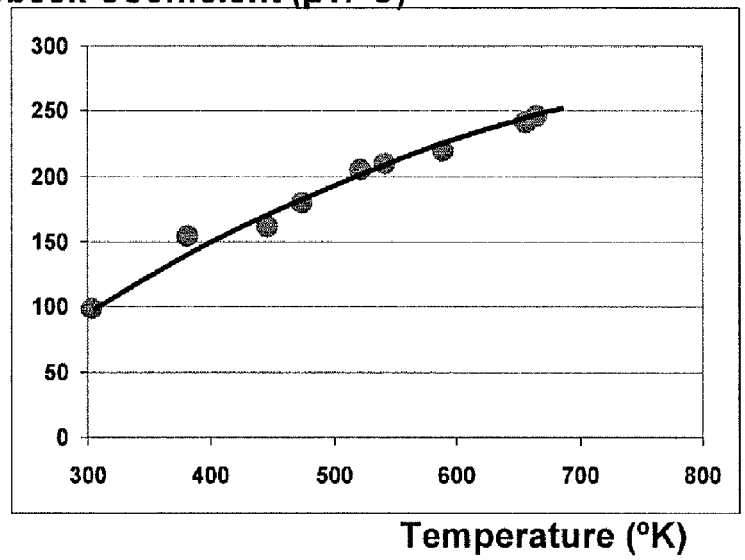
FIG. 17 is a graph showing the temperature dependence of the Seebeck coefficient of $Ag_xPbTe$ thin films.
Figure 18:
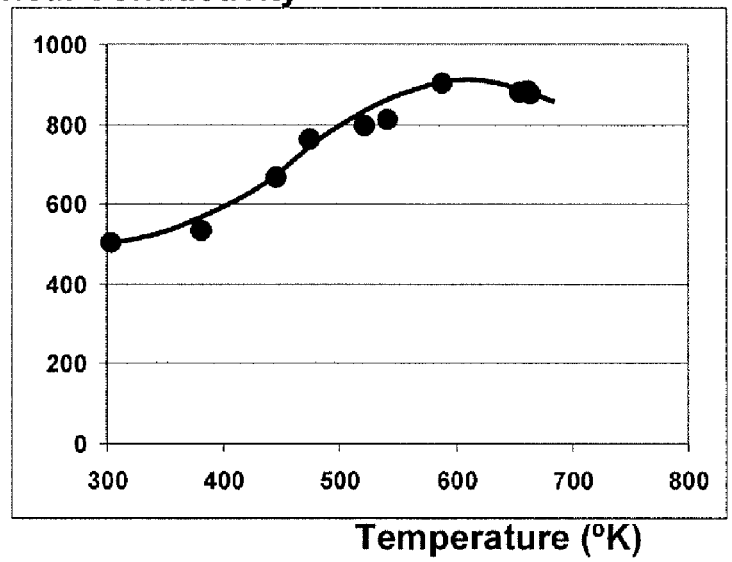
FIG. 18 is a graph showing the temperature dependence of the electrical conductivity coefficient of $Ag_xPbTe$ thin films.
Figure 19:
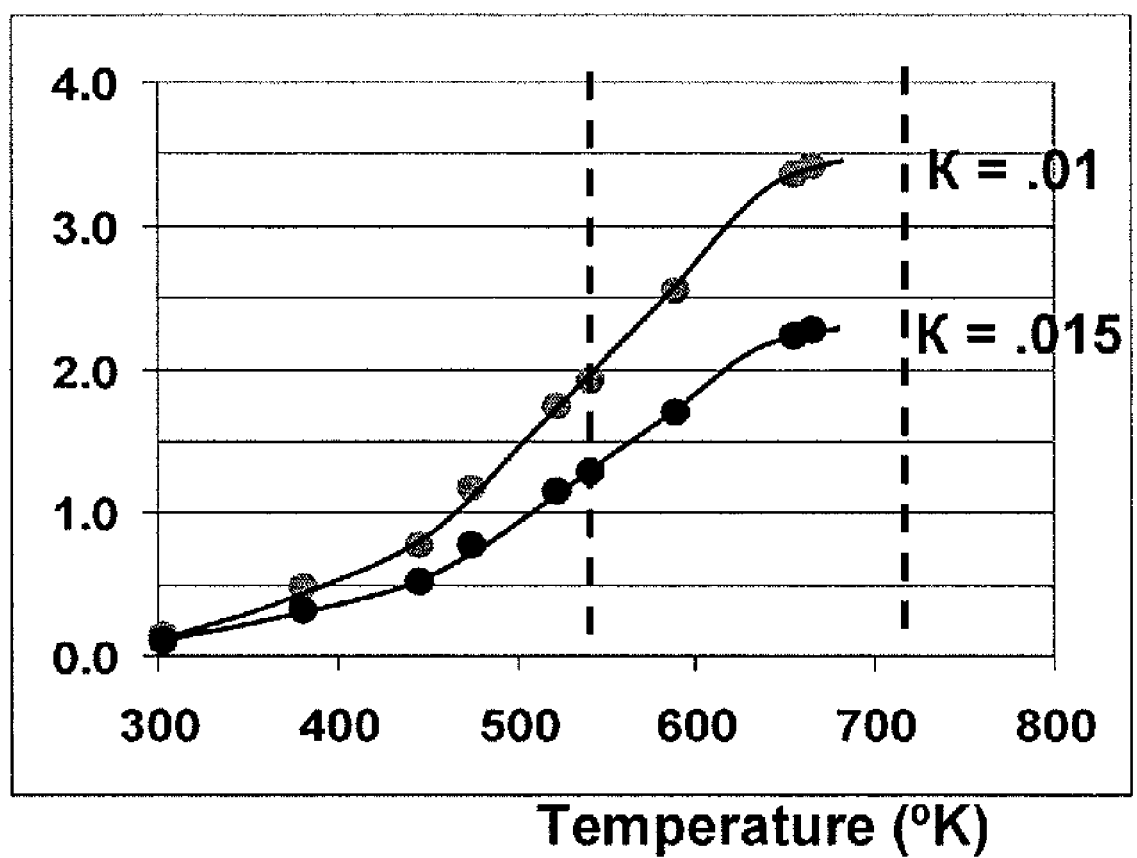
FIG. 19 is a graph showing the temperature dependence of the Figure of merit (ZT) of $Ag_xPbTe$ thin films for assumed values of thermal conductivity ($\kappa$).
Figure 21:
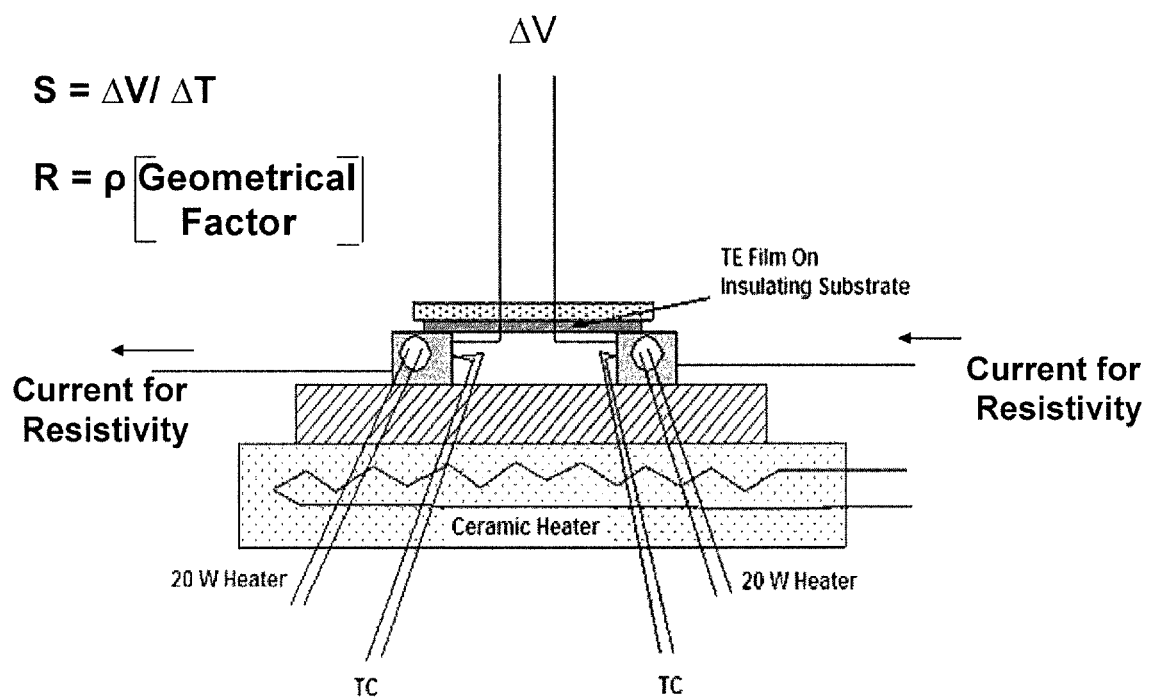
FIG. 21 illustrates a fabrication apparatus for making embodiments of the thin film deposits as disclosed.

FIGS. 16 and 17 illustrate measured properties of the sputter deposited GAST thin films disclosed herein. (Examples of the deposition of these materials are given in Examples 4 (p-type) and 5 (n-type) below.) Once a thin film is deposited, the electrical conductivity and Seebeck coefficient are measured versus temperature as illustrated in FIG. 21. As shown in FIG. 16, the properties of the deposited GAST material vary with the film being at the indicated temperature. Example 4 describes an embodiment at useful conditions of growth for GAST p-type materials. In many embodiments the GAST p-type films are grown on a substrate held at from about 300° C. to about 330° C. FIGS. 17 and 18 illustrate similar effects for $Ag_xPbTe$ thin films. FIGS. 17 and 18 show electrical conductivity and Seebeck coefficients versus temperature for a AgxPbTe film with a thickness of a few microns. The material composition is PbTe with a trace of Ag.

The electrical resistivity ($\rho$) and Seebeck coefficient (S) of thin films were measured with an apparatus as shown in FIG. 21. The films are deposited onto glass or polyimide substrates. These substrates are electrically insulating and therefore do not affect the measurement of $\rho$ or S. Once a sample is loaded into the structure as illustrated in the figure, it is placed into a vacuum chamber and the pressure is reduced to a pressure of less than 0.01 mTorr. A ceramic heater is used to vary the sample temperature between ambient and 400° C. Two 20 Watt heaters are used to establish a temperature difference across the sample to determine the Seebeck coefficient.

Measurement of electrical resistivity and Seebeck coefficient for a thin film proceeded as follows: (1) after forming an adequate vacuum, adjust the ceramic heater power such that the sample is at a uniform temperature between ambient and 400° C.; (2) using the 20 watt heater on the right hand side of FIG. 21, increase the temperature of the right hand side of the film to approximately 20° C. above the left hand side of the film; (3) measure the voltage ($\Delta VR$) developed across the film and calculate $SR=\Delta VR/\Delta TR$; (4) reduce the power to the right hand side to zero, and increase the power to the left hand side such that $\Delta TL$ is approximately 20° C. above the right hand side of the film; (5) measure the voltage ($\Delta VL$) and calculate $SL=(\Delta VL)/\Delta TL$; (6) the film resistivity is determined by applying a current as shown and measuring the voltage across the sample to obtain the film electrical resistance. The sign of SR indicates whether the sample is n-type (negative) or p-type (positive) and the magnitude of S is determined by averaging the values of SR and SL. The film resistivity is determined by accounting for the geometrical factor, namely, $\rho=RA/L$ where R is the measured resistance, L the length of the film and A the cross sectional area. It should be noted that the film electrical conductivity $\sigma$ is given by $\sigma=1/\rho$ The temperature difference across sample is zero when measuring resistance of the film.

The sputter deposited GAST thin films forming the thermoelements may vary in thickness such as 0.1 to 100 micrometers but certain embodiments of the disclosed TE devices include thermoelements having thicknesses of about 0.1 to 10 micrometers or about 0.1 micrometers. The desirable thickness depends on the ultimate application of the TE power source being fabricated. For example, if the intended use is for batteries in the microwatt to milliwatt power range, a preferred thickness range for the sputter deposited GAST thin film will be in the 0.1 to 100 micrometer thickness range.

The thermoelements may vary in area but certain embodiments of the disclosed TE devices include thermoelements having an L/A ratio of greater than at least about 20 $cm^{-1}$ or greater than about 100 $cm^{-1}$ with certain embodiments having an L/A ratio of greater than 1000, 10,000 and even higher for devices operating at a lower power application, such as at or below about 1 Watt. For power level applications greater than about 1 Watt the thin film thermoelements have an L/A ratio of greater than at least about 100 $cm^{-1}$ or about 10 to about 1000 $cm^{-1}$. The range for the L, A and thickness values depend on the power requirements of the ultimate TE power source being made.

Substrate Materials

In certain embodiments, the p-type and n-type TE thermoelements are deposited onto a flexible substrate. The flexible substrate may be, e.g., a polyimide, such as KAPTON, however, any suitable flexible substrate may be used. The substrate should be able to withstand sputter deposition conditions without undue deterioration. The substrate preferably has relatively low values of electrical and thermal conductivity. In other embodiments TE materials are deposited on a substrate comprising any suitable sufficiently rigid substrate (e.g., glass or other electrically insulating materials that possess relatively low thermal conductivities). Essentially any electrically insulating substrate 140 (FIG. 2a) (or substrate coated with an insulating material) may be utilized for the rigid or flexible TE device as long as the substrate can withstand the deposition conditions and can meet required thermal conductivity levels.

Electrically Conductive Members

As discussed above, TE modules are formed by electrically connecting a thin film n-type thermoelement to a p-type thermoelement through electrically conductive members. The electrically conductive members may comprise any suitable electrically conductive material. For example, the electrically conductive members may comprise a metal, such as aluminum, gold, nickel, and mixtures thereof. In one particular embodiment the conductive members comprise a nickel layer formed on the substrate and a gold layer formed on the nickel layer.

Methods for Constructing Thin Film TE Elements

Figure 12A:
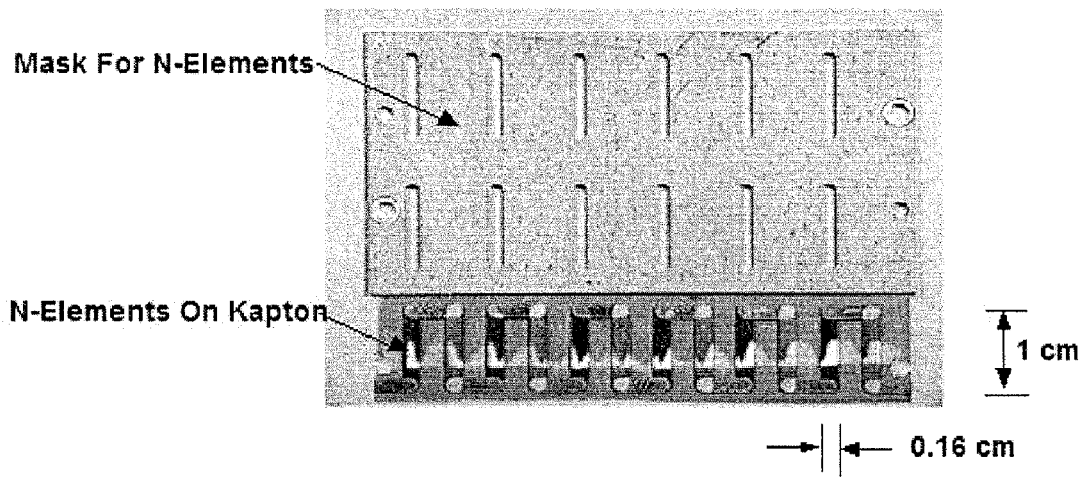
FIG. 12a is a photograph of a representative mask suitable for use in depositing n-type thermoelements in the configuration shown in the embodiments of the TE modules of FIG. 2a and FIG. 6.
Figure 12B:
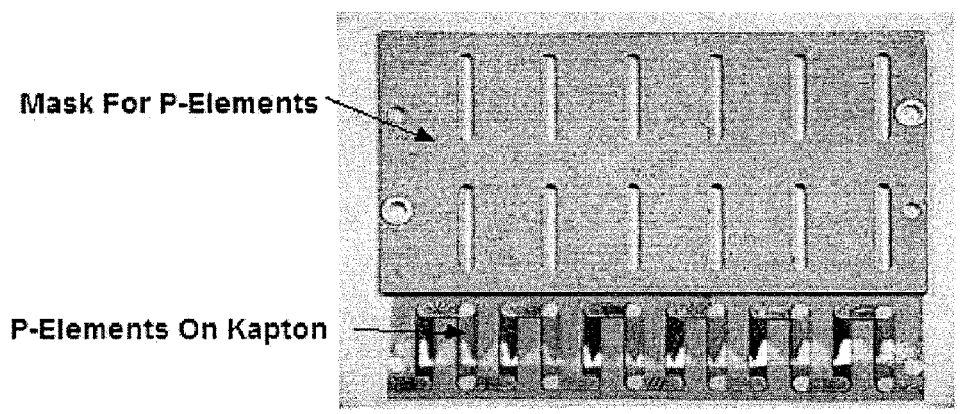
FIG. 12b is a photograph of a representative mask suitable for use in depositing p-type thermoelements in the configuration shown in the embodiments of the TE modules of FIG. 2a and FIG. 6.
Figure 12C:
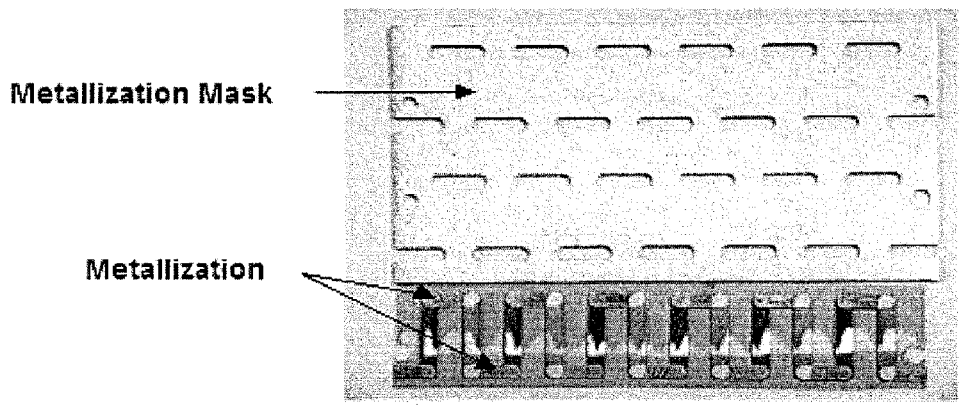
FIG. 12c is a photograph of a representative mask suitable for use in depositing conducting connectors in the configuration shown in the embodiments of the TE modules of FIG. 2a and FIG. 6.
Figure 13:
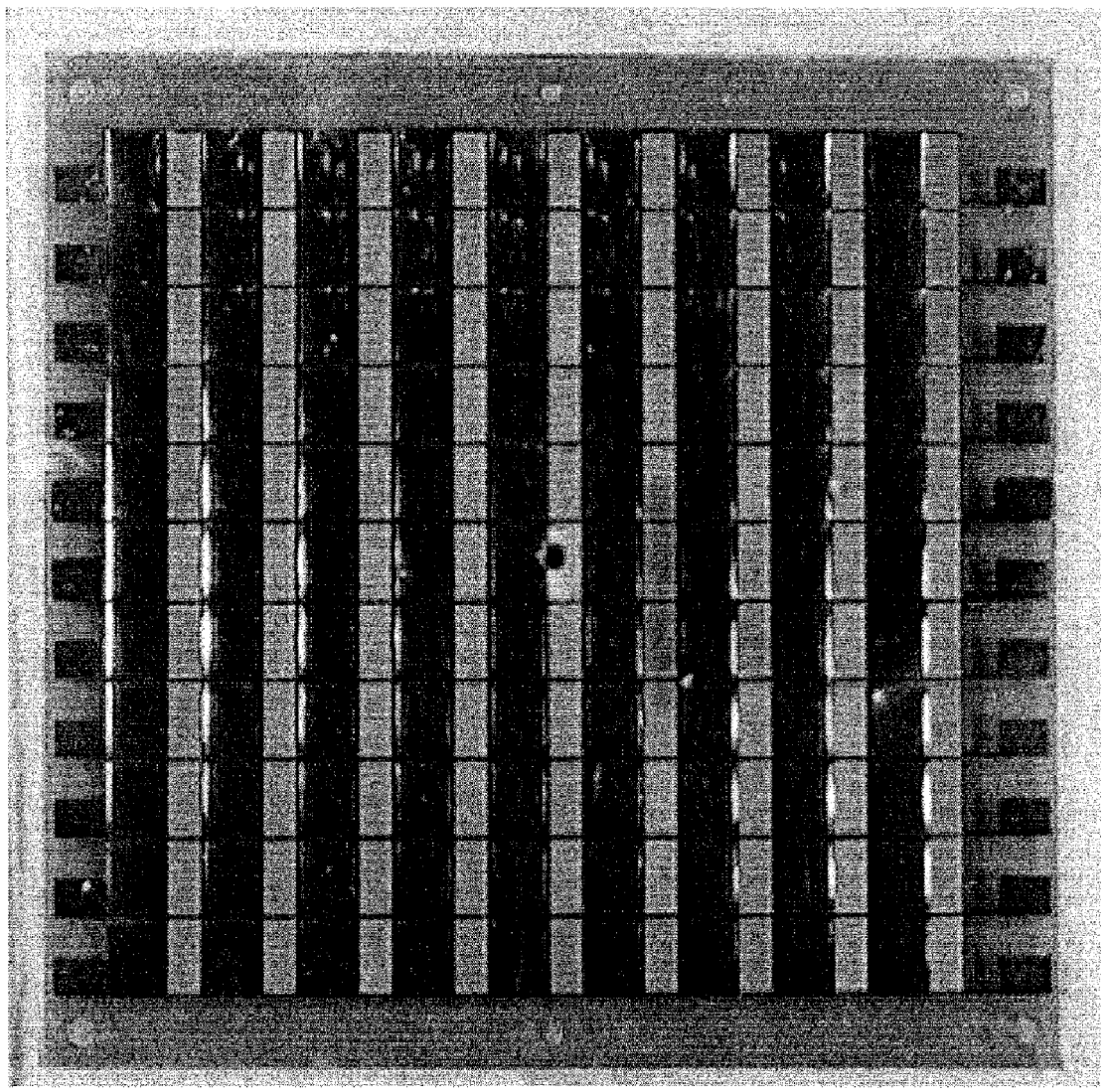
FIG. 13 is a photograph of disclosed n-type and p-type TE thin film modules deposited on a flexible substrate.

TE thin film thermoelements and TE modules are formed by sputter deposition. In particular embodiments a mask or template is used as shown in FIGS. 12a-12c. The masks may be formed by standard lithography and/or etching techniques to control the shape and position of each TE thermoelement and conductive member on a substrate.

Figure 2B:
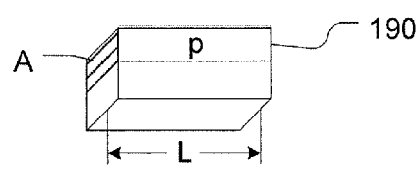

The disclosed process allows for the deposition of many (e.g., hundreds, thousands, or more) TE thermoelement couples on flexible materials such as KAPTON polyimide (available from DuPont). A representative individual p-type TE thermoelement 190 is shown in FIG. 2b, which also illustrates the L/A ratio. High voltage, μW to mW (or greater, e.g., W) TE power sources comprising hundreds or thousands of TE modules can be made with the disclosed process.

Figure 11:
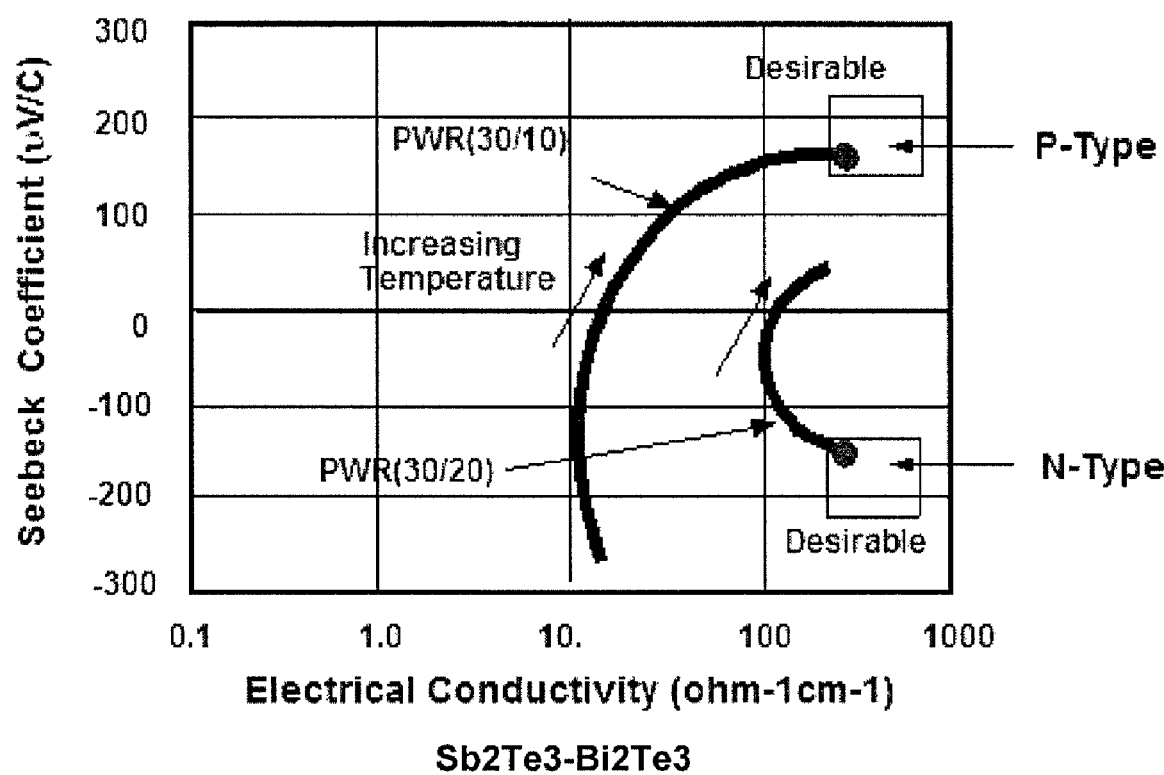
FIG. 11 is a graph showing the dependence of the Seebeck coefficient and electrical conductivity of TE materials deposited on a KAPTON substrate, with sputter deposition conditions.

With reference to FIG. 11 and Table 1 below, a wide range of sputter deposition process parameters were used to obtain the BiTe TE thermoelement materials having desirable properties. In particular, a myriad of sputtering gas pressures, target powers, deposition rates, target-substrate distances and substrate temperatures were tested. Certain exemplary sputter deposition methods are specifically disclosed below but clearly other sputter deposition parameters may produce suitable thin films for forming the TE thermoelements disclosed herein.

The thin films forming the TE elements may be sputter deposited using, for example, RF magnetron sputtering. The films may be deposited simultaneously from two of three possible sources, for example, and not meant to be limiting, $Bi_2Te_3$, $Sb_2Te_3$ and $Bi_2Se_3$ alloys, or combinations thereof. The amount of RF power supplied to each of the targets, substrate temperature and sputtering gas pressure are varied for deposition conditions that result in films with desired properties which in turn depend upon the application of the device. Representative thin film material parameters and sputtering conditions for $Bi_2Te_3$, $Sb_2Te_3$ and $Bi_2Se_3$ alloys are shown in FIG. 11. The specific examples given below are not to be considered limiting of the present disclosure but merely representative.

The GAST p-type thin films forming the thermoelements are made using sputter deposition. The thin films of the material are grown by co-sputtering from targets of $AgSbTe_2$ and GeTe. With reference to FIG. 20 certain embodiments of the disclosed methods include co-sputtering from two targets on a flat substrate configuration.

Process variables may be adjusted to control properties of the deposited material. Such variables include: (1) substrate temperature; (2) power supplied to the $AgSbTe_2$ target; (3) power supplied to the GeTe target; and/or (4) the sputter gas pressure. Good results have been achieved with process parameters set at or near those listed in Table Q1. The composition of an embodiment of a GAST film having desirable TE properties is described in Table Q2

TABLE Q1

Example Process Parameters for GAST Thin Film Deposition

| Substrate Temperature | Sputtering Gas Pressure | Power to AgSbTe2 Target | Power to GeTe Target |
|---|---|---|---|
| 330° C. | 3 mTorr | 1.3 W/cm² | 3.6 W/cm² |

TABLE Q2

Embodiment of a GAST Thermoelectric Material Composition

| Ge | 13.6 | Atomic % |
|---|---|---|
| Ag | 1.5 | Atomic % |
| Sb | 5.7 | Atomic % |
| Te | 79.2 | Atomic % |

PbTe based n-type materials, such as $Ag_xPbTe$ n-type thin films, have been sputter deposited onto various substrates. Such depositions involve sputtering from mixtures of PbTe and Ag, PbTe and Te targets and sputtering from mixtures of PbTe and PbSe targets to achieve the n-type materials.

Example 1

Sputter Deposition of n-Type Thin-Film Thermoelements

A substrate comprising KAPTON (as well as a glass substrate) was positioned 5 inches from both a $Sb_2Te_3$ (Sb—Te) and a $Bi_2Te_3$ (Bi—Te) target in a standard sputter deposition chamber. Each target measured 2 inches in diameter. The sputter deposition chamber was evacuated to a pressure of $10^{-6}$ Torr and the system was then filled with purified argon adding to the system sputtering gas pressure (e.g., 3.0 mTorr). Substrates were ion cleaned for 3 to 5 minutes using an ion gun in the presence of a gas consisting of argon with 1 atomic % of oxygen. Target surfaces were then cleaned by establishing plasmas above the targets with 30 watts of power being supplied to the Sb—Te target and 20 watts of power to the Bi—Te target, but substrates covered to prevent material deposition onto the substrates. The deposition was then carried out with the substrates at ambient temperature. Under these conditions, the deposition rate was 3.5 Å/s. Thus, to deposit a one micron thick film required approximately 47 minutes.

After deposition, the thermoelectric thin films were characterized. The thickness was measured with a profilometer. The resistivity and Seebeck coefficient also were determined for the deposited thermoelectric thin films, as shown in FIG. 11. Resulting values are provided in Table 1.

TABLE 1

Exemplary Parameters Growth of N-Type Sb—Te/Bi—Te Films On KAPTON*

| Substrate Temperature (° C.) | Sputtering Gas Press (mTorr) | Power-SbTe (Watts) | Power-BiTe (Watts) | Growth Rate (Å/s) | Electrical Conductivity (ohm⁻¹cm⁻¹) | Seebeck Coefficient (μV/° C.) |
|---|---|---|---|---|---|---|
| Ambient | 3.0 | 30 | 10 | 2.6 | 15.0 | −264 |
| Ambient | 3.0 | 30 | 20 | 3.3 | 149 | −149 |
| Ambient | 3.0 | 30 | 22 | 3.7 | 93.2 | −142 |
| Ambient | 2.0 | 30 | 30 | 3.8 | 289 | −104 |

*Sputtering Gas Pressure was 3.0 mTorr; Targets had 2.0 inch diameters; Sb—Te and Bi—Te targets were positioned 5 inches from substrate platform.

The process parameters used for deposition will depend on the desired values for the Seebeck coefficient and electrical conductivity. For power sources discussed in Example 3, the optimum set of TE properties were those given by deposition at ambient temperatures, pressure of 3.0 mTorr and with 30 and 20 Watts applied to the Sb—Te and Bi—Te targets, respectively.

Example 2

Sputter Deposition of p-Type Thin-Film Thermoelements

A substrate comprising KAPTON (as well as a glass substrate) was positioned 5 inches from both a $Sb_2Te_3$ (Sb—Te) and a $Bi_2Te_3$ (Bi—Te) target in a standard sputter deposition chamber. Each target measured 2 inches in diameter, and the target centers were separated by 3 inches. The sputter deposition chamber was evacuated to a pressure of $10^{-6}$ Torr and the system was then filled with purified argon adding to the system sputtering gas pressure (e.g., 3.0 mTorr). The substrates were ion cleaned for 3 to 5 minutes. The substrate temperature was then raised to 300° C. Plasmas were established above the targets with 30 watts of power supplied to the Sb—Te target and 10 watts of power to the Bi—Te target. After sputtering from the targets for a few minutes, shutters covering the substrates were removed and film deposition began. The film growth rate was 3.0 Å/s. Thus, to deposit a one micron thick film required approximately 55 minutes. After deposition, the thermoelectric thin films were characterized. The thickness was measured with a profilometer. The resistivity and Seebeck coefficient also were determined for the deposited thin films. Resulting values are provided in Table 2. Also shown in Table 2 are film properties achieved for other sputtering parameters.

The process parameters used for deposition will depend on the desired values for the Seebeck coefficient and electrical conductivity. For power sources discussed in Example 3, the optimum set of TE properties were those given by deposition at substrate temperatures near 300° C., a sputtering gas pressure of 3.0 mTorr and with 30 and 10 Watts applied to the Sb—Te and Bi—Te targets, respectively.

Specifically, a KAPTON substrate sheet using a mask as shown in FIG. 12b was positioned into a deposition chamber. The mask was securely positioned over the KAPTON sheet using round holes at each end of the mask (see FIG. 12b). Target choices and positioning and other deposition conditions and parameters were as described in Example 2.

Once the desired p-type elements were deposited, the process was stopped and the sputter deposition system opened to replace the p-type mask of FIG. 12b with an n-type mask such as the mask depicted in FIG. 12a. The n-type mask was carefully positioned over the KAPTON sheet, again using the round holes in the mask as guides. Target choices, positioning and other deposition conditions for p-type and n-type elements were as described in Examples 1 and 2.

The process was again stopped once the n-type thermoelements were deposited to replace the n-type mask and with a metallization mask such as the mask depicted in FIG. 12c to form the electrically conductive members. The metallization mask was positioned and secured over the KAPTON sheet using round holes in the mask as guides. By standard sputter deposition procedures, 1.0 μm of aluminum was first deposited, followed by 0.1 μm of nickel.

These deposition processes produced an array of p-type and n-type thermoelement modules on a flexible substrate in the configuration shown in FIGS. 2a, 12a-12c, and 13.

The specific templates or masks shown in FIGS. 12a-12c in the foregoing procedure were used to produce two arrays of six thermocouples deposited on two different strips of KAPTON substrate. Such arrays of TE modules were, for example, assembled into a TE power source such as shown in FIG. 5. The fabrication of arrays of six TE modules would allow for production of, e.g., a 25 μW TE power source with a 1.0 V output at a temperature gradient of only 20° C.

Example 4

Sputter Deposition of p-Type GAST Films

A substrate comprising KAPTON is positioned 5 inches from sputtering targets in a standard sputter deposition chamber. GAST films are grown by co-sputtering from two targets as depicted in FIG. 20, one target being made of $AgSbTe_2$ or

TABLE 2

Exemplary Parameters Growth of P-Type Sb—Te/Bi—Te Films On KAPTON*

| Substrate Temperature (° C.) | Sputtering Gas Press (mTorr) | Pwr-SbTe (Watts) | Pwr-BiTe (Watts) | Growth Rate (Å/s) | Electrical Conductivity ($ohm^{-1}cm^{-1}$) | Seebeck Coefficient (μV/° C.) |
|---|---|---|---|---|---|---|
| 125 | 3.0 | 30 | 10 | 2.6 | 31.7 | 82 |
| 200 | 3.0 | 30 | 10 | 2.4 | 244 | 146 |
| 250 | 3.0 | 30 | 10 | 2.7 | 222 | 145 |
| 250 | 3.0 | 30 | — | 2.1 | 571 | 110 |
| 300 | 3.0 | 30 | 10 | 3.0 | 308 | 158 |

*Sputtering Gas Pressure was 3.0 mTorr; Targets had 2.0 inch diameters; Sb—Te and Bi—Te targets were positioned 5 inches from substrate platform.

Example 3

Fabrication of a Thermoelectric Array on KAPTON

Figure 9A:
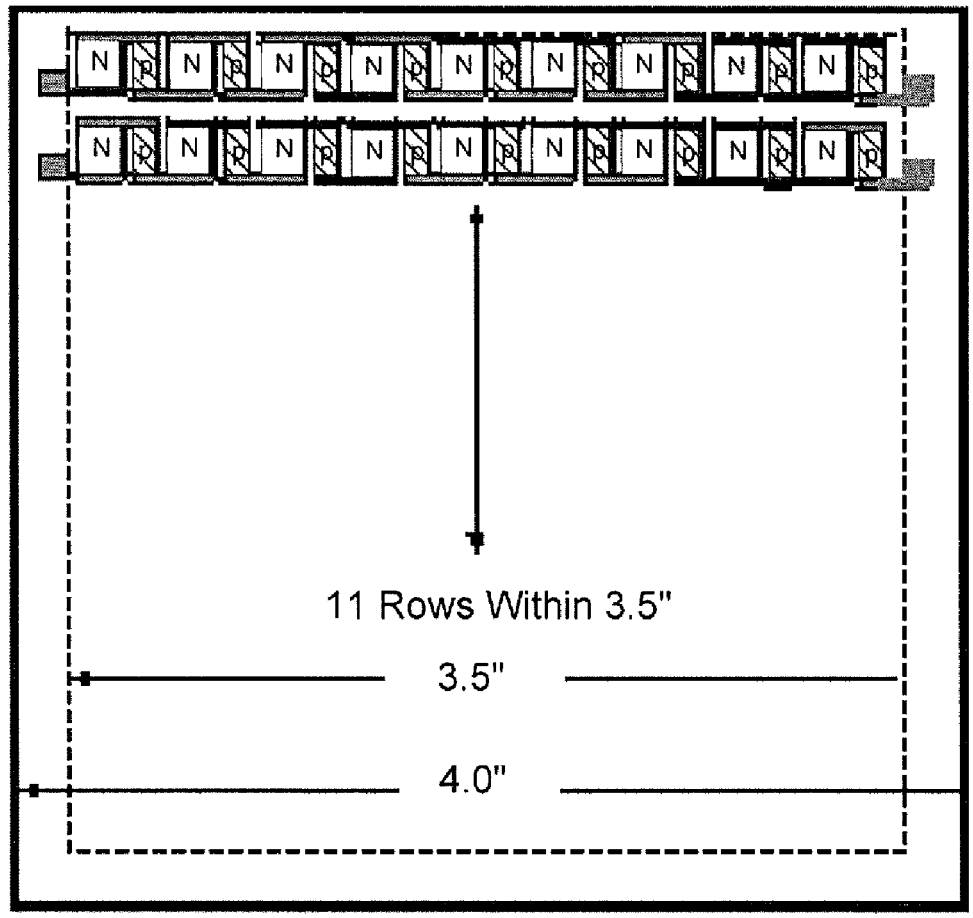
FIG. 9a is an illustration of disclosed n-type and p-type TE thin film modules deposited in an array configuration on a substrate, with representative dimensions for the same.
Figure 9B:
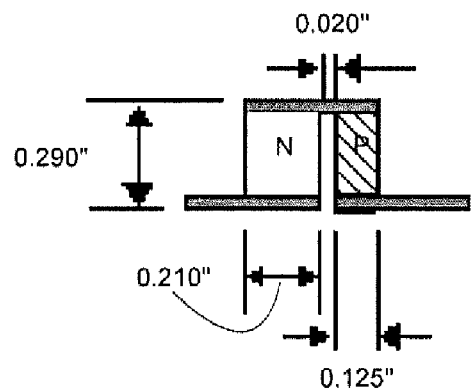
Figure 10:
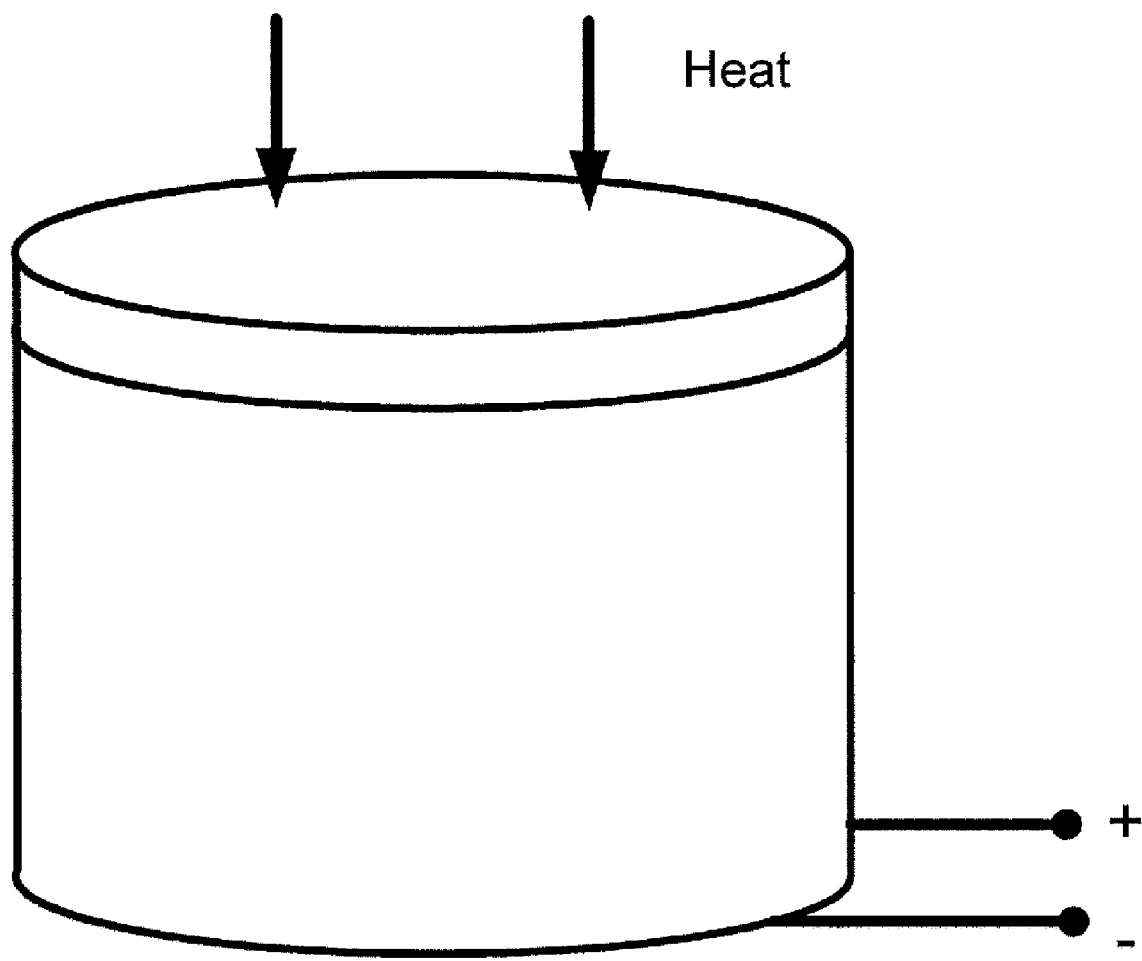
FIG. 10 illustrates a TE sensor that uses heat from one side of the thermopile.

A TE module array like those shown in FIG. 1a or 9a was fabricated on a substrate comprising KAPTON using masks such as those depicted in FIGS. 12a-12c. The p-type thermoelements were deposited first because they are deposited at 300° C. The n-type thermoelements were deposited next and then the electrically conductive members were deposited.

$Sb_2Te_3$, and the other being GeTe. The sputter deposition chamber was evacuated to a pressure of $10^{-6}$ Torr and the system was then filled with purified argon adding to the system sputtering gas pressure (e.g., 3.0 mTorr). Substrates were ion cleaned for 3 to 5 minutes using an ion gun in the presence of a gas consisting of argon with approximately 1 atomic % of oxygen. After cleaning target surfaces for 3 to 5 minutes by establishing plasmas above the targets, film deposition was carried out. Film properties depend on the substrate temperature, sputtering gas pressure and power supplied to the targets. Several example GAST films are described in Table 3.

After deposition the thermoelectric thin films were characterized. The thickness was measured with a profilometer. The resistivity and Seebeck coefficient also were determined for the deposited thermoelectric thin films, as shown in FIG. 16.

TABLE 3

Exemplary Parameters Growth of P-Type GAST Films*

| Run & Substrate Temperature (° C.) | Sputtering Gas Press (mTorr) | Power $Sb_2Te_3$ or $AgSbTe_2$ (Watts) | Power GeTe (Watts) | Growth Rate (Å/s) | Electrical Conductivity ($ohm^{-1}cm^{-1}$) | Seebeck Coefficient ($\mu V/°$ C.) |
|---|---|---|---|---|---|---|
| Run 2K-S 300 | 3.0 | $Sb_2Te_3$ 25 | 51 | Pos #1 7.0 | 30° C.: 760 250° C.: 740 | 30° C.: 140 250° C.: 260 |
| Run 3C-S 330 | 3.0 | $AgSbTe_2$ 60 | 138 | Pos #1 22.0 | 30° C.: 650 250° C.: 620 | 30° C.: 150 250° C.: 215 |
| Run 4G-S 330 | 3.0 | $AgSbTe_2$ 60 | 164 | Pos #1 1.0 Pos #2 1.1 | 30° C.: 1580 250° C.: 1250 30° C.: 300 250° C.: 330 | 30° C.: 80 250° C.: 160 30° C.: 200 250° C.: 200 |

*Target Sizes: GeTe and $AgSbTe_2$ have diameters of 3"; $Sb_2Te_3$ has a diameter of 2"

Process parameters and measured values of electrical conductivity and Seebeck coefficient are given in Table 4 for films grown at two substrate locations, referred to as position 1 and 2, and for two temperatures, ambient and 250° C. (Table 3). The films were grown at either 300° C. or 330° C. The first example is for a film co-sputtered from $Sb_2Te_3$ and GeTe targets and therefore has no silver as a constituent. As discussed previously, the composition of GAST films do not obey the formula $(AgSbTe_2)_{1-x}(GeTe)_x$. For example, consider the film grown for Run 3C-S. The composition of this film is given in Table 4. Note that the atomic percentage of Sb is significantly larger than that of Ag. Furthermore, the atomic percentage of Ge is much more than that of Sb.

TABLE 4

Typical Composition of GAST Thermoelectric Material*

| Ge | 13.6 | Atomic % |
| Ag | 1.5 | Atomic % |
| Sb | 5.7 | Atomic % |
| Te | 79.2 | Atomic % |

*Compositions determined by energy dispersive x-ray analysis

Example 5

Sputter Deposition of N-Type PbTe-Based TE Thin Films

A substrate comprising KAPTON was positioned 5 inches from sputtering targets in a standard sputter deposition chamber. N-type PbTe based films (hereinafter referred to as NPT films) were grown by co-sputtering from two targets as depicted in FIG. 21, one target being PbTe and the other one being of one of several possibilities, namely: Ag, Te or PbSe. The sputter deposition chamber was evacuated to a pressure of $10^{-6}$ Torr and the system was then filled with purified argon adding to the system sputtering gas pressure (e.g., 3.0 mTorr). Substrates were ion cleaned for 3 to 5 minutes using an ion gun in the presence of a gas consisting of argon with approximately 1 atomic % of oxygen. After cleaning target surfaces for 3 to 5 minutes by establishing plasmas above the targets, film deposition was carried out. Film properties depend on the substrate temperature, sputtering gas pressure and power supplied to the targets. Several examples of NPT films are described in Table 5.

After deposition, the thermoelectric thin films were characterized. The thickness was measured with a profilometer. The resistivity and Seebeck coefficient also were determined for the deposited thermoelectric thin films, as shown FIGS. 17 and 18.

TABLE 5

Exemplary Parameters Growth of N-Type PbTe-Based Films On KAPTON*

| Substrate Temperature (° C.) | Sputtering Gas Press (mTorr) | Power PbTe (Watts) | Power Other Target (Watts) | Growth Rate (Å/s) | Electrical Conductivity ($ohm^{-1}cm^{-1}$) | Seebeck Coefficient ($\mu V/°$ C.) |
|---|---|---|---|---|---|---|
| 1M-S | 3.0 | 60 | Ag: 1 | 4.4 | 460 | −87.3 |
| 1N-S | 3.0 | 60 | Ag: 5 | 4.4 | 30° C.: 503 250° C.: 795 | 30° C.: −87.1 250° C.: −204 |
| 1U-S 300° C. | 3.0 | 30 | PbSe: 30 | 4.2 | 30° C.: 101 | 30° C.: −171 |
| 1F-S Ambient | 3.0 | 60 | Te: 10 | 5.2 | 30° C.: 66 | 30° C.: −179 |
| 1H-S Ambient | 1.0 | 60 | Te: 10 | 5.0 | 30° C.: 307 | 30° C.: −109 |

Target sizes: PbTe and PbSe have diameters of 3"; and Ag and Te have 2" diameters.

Whereas the TE thermoelements, modules, arrays and power sources as well as the methods for making the same have been described with reference to multiple embodiments and examples, it will be understood that the invention is not limited to those embodiments and examples. On the contrary, the invention is intended to encompass all modifications, alternatives, and equivalents as may be included within the spirit and scope of the invention as defined by the appended claims.

We claim:

1. A method of making a thermoelectric power source comprising:
    (a) providing a flexible substrate having an upper surface
    (b) forming a thermocouple by
        (i) sputter depositing a thin film of p-type material comprising Ge, Ag, Sb, and Te to form at least one thermoelement on the upper surface of the flexible substrate and
        (ii) sputter depositing a thin film of an n-type material to form at least one thermoelement positioned on the upper surface of the flexible substrate adjacent the p-type thermoelement; and
        (iii) forming an electrically conductive member electrically connecting the first end of the p-type thermoelement in electrical contact with the second end of the n-type thermoelement.

2. The method of claim 1 wherein the p-type thermoelements have L/A ratios greater than about 20 cm$^{-1}$.

3. The method of claim 1 wherein the sputter depositing of the p-type thermoelement further comprises forming the p-type material to comprise: Ge from about 0.01 to about 25 atomic percent, Ag from about 0.01 to about 10 atomic percent, Sb from about 0.01 to about 20 atomic percent and Te from about 60 to about 90 atomic percent.

4. The method of claim 1 wherein the n-type thin film comprises $(Ag_xPbTe/M)_n$ wherein M may comprise PbTe, SbTe, $Sb_2Te_3$, $Bi_2Te_3$, or mixtures thereof.

5. The method of claim 1 wherein the sputter depositing of the n-type thermoelement further comprises forming the n-type thin film thermoelement composition to comprise Ag from about 0.01 to about 10 atomic percent, Pb from about 35 to about 55 atomic percent and Te from about 40 to about 60 atomic percent.

6. The method of claim 1 wherein the sputter depositing of the n-type thermoelement further comprises forming the n-type material to form a thin film consisting essentially of Ag, Pb and Te.

7. The method of claim 6 further comprising sputter depositing the p-type thermoelements to have a thickness of less than about 0.01 cms.

8. The method of claim 1 wherein the sputter depositing of the p-type thermoelement further comprises forming the p-type material to comprise about 14 atomic percent Ge, about 2 atomic percent Ag, about 6 atomic percent Sb and about 78 atomic percent Te.

9. The method of claim 1 further comprising forming at least about 500 thermocouples on the flexible substrate such that the thermoelectric power source has a power output of at least about 10 µW with a voltage of at least about 0.1 volt.

10. The method of claim 1 further comprising sputter depositing the p-type thermoelements to have different widths as compared to the sputter deposited n-type thermoelements.

11. The method of claim 1 wherein two or more p-type thermoelements are positioned and electrically connected in parallel with one another and the parallel positioned p-type thermoelements are electrically connected in series to n-type thermoelements.

12. The method of claim 1 further forming including multiple thermocouples electrically connected in series on the upper surface of the flexible substrate and subsequently winding the flexible substrate into a coiled configuration.

13. The method of claim 1 wherein the thermoelectric power source is formed to have a volume of less than about 10 cm$^3$ and has a power output of at least about 50 µW.

14. The method of claim 1 wherein the thermoelectric power source is formed to have a volume of less than about 10 cm$^3$ and provide voltages of greater than about 1.0 volt.

15. The method of claim 1 wherein the thermoelectric power source is formed to produce power at temperature differences of about 20° C. or less.

16. The method of claim 1 wherein the thermoelectric power source is formed to operate in an environment of from about 400 to about 600° C.

17. The method of claim 1 further comprising spooling the flexible substrate with the thermoelements sputter deposited thereon to form the thermoelectric power source such that the device is in a coil configuration.

18. A method of forming a thermoelectric power source comprising:
    forming at least about 500 thermocouples and electrically connecting the thermocouples to one another on an upper surface of a flexible substrate, the forming of the thermocouples comprising:
    sputter depositing thin films of GAST p-type material comprising Ge, Ag, Sb, and Te, thereby forming p-type thermoelements;
    sputter depositing thin films of n-type material forming n-type thermoelements alternatingly positioned adjacent the p-type thermoelements; and
    forming the thermoelectric power source such that it occupies a volume of less than about 10 cm$^3$ and has a power output of at least about 50 µW.

19. The method of claim 18 further comprising spooling the flexible substrate with the thermoelements formed thereon to form the thermoelectric power source.

20. The method of claim 18 wherein the p-type thermoelements have L/A ratios greater than about 20 cm$^{-1}$.

21. The method of claim 18 wherein the sputter depositing of the p-type thermoelement further comprises forming the p-type material to comprise Ge from about 10 to about 25 atomic percent, Ag from about 0.5 to about 10 atomic percent, Sb from about 1 to about 20 atomic percent and Te from about 60 to about 90 atomic percent.

22. The method of claim 18 wherein the sputter depositing of the n-type thermoelement further comprises forming the n-type thin film thermoelement composition to comprise Ag from about 0.01 to about 10 atomic percent, Pb from about 35 to about 55 atomic percent and Te from about 40 to about 60 atomic percent.

23. The method of claim 18 wherein the sputter depositing of the p-type thermoelement further comprises forming the p-type material to comprise about 14 atomic percent Ge, about 2 atomic percent Ag, about 6 atomic percent Sb and about 78 atomic percent Te.

* * * * *

UNITED STATES PATENT AND TRADEMARK OFFICE
CERTIFICATE OF CORRECTION

PATENT NO. : 7,851,691 B2
APPLICATION NO. : 11/864595
DATED : December 14, 2010
INVENTOR(S) : John G. DeSteese et al.

It is certified that error appears in the above-identified patent and that said Letters Patent is hereby corrected as shown below:

In the Specification:

In column 9, line 1, the word "CAST" should be --GAST--.

In column 9, lines 62-63, the words "however those materials and devices made using those materials that differ significantly" should be --however those devices made using those materials differ significantly--.

In column 10, line 56, the word "CAST" should be --GAST--.

In column 11, line 65, the letter "a" should be --σ--.

In column 16, line 16, the words "and with a" should be --with a--.

In the Claims:

In column 20, line 6, the words "forming including" should be --including forming--.

Signed and Sealed this
Twentieth Day of November, 2012

David J. Kappos
*Director of the United States Patent and Trademark Office*